(12) United States Patent
Tertois et al.

(10) Patent No.: US 9,536,022 B1
(45) Date of Patent: Jan. 3, 2017

(54) SYSTEMS AND METHODS FOR MODELING FAULTS IN THE SUBSURFACE

(71) Applicants: PARADIGM SCIENCES LTD., George Town (KY); Jean-Laurent Mallet, Garnich (LU)

(72) Inventors: Anne-Laure Tertois, Crawley (GB); Jean-Laurent Mallet, Garnich (LU); Laurent Deny, Houston, TX (US); Jean-Claude Dulac, Sugarland, TX (US)

(73) Assignees: PARADIGM SCIENCES LTD., Grand Cayman (KY); Jean-Laurent Mallet, Luxembourg-Beggen (LU)

( * ) Notice: Subject to any disclaimer, the term of this patent is extended or adjusted under 35 U.S.C. 154(b) by 798 days.

(21) Appl. No.: 13/862,680

(22) Filed: Apr. 15, 2013

Related U.S. Application Data

(63) Continuation of application No. 12/791,483, filed on Jun. 1, 2010, now abandoned.

(60) Provisional application No. 61/182,843, filed on Jun. 1, 2009.

(51) Int. Cl.
*G06G 7/48* (2006.01)
*G06F 17/50* (2006.01)

(52) U.S. Cl.
CPC ..... *G06F 17/5009* (2013.01); *G01V 2210/642* (2013.01)

(58) Field of Classification Search
CPC .............................................. G01V 2210/642
USPC ......................................................... 703/10
See application file for complete search history.

(56) References Cited

U.S. PATENT DOCUMENTS

| 4,964,099 A | 10/1990 | Carron |
| 4,991,095 A | 2/1991 | Swanson |
| 5,465,323 A | 11/1995 | Mallet |
| 5,475,589 A | 12/1995 | Armitage |
| 5,586,082 A | 12/1996 | Anderson et al. |

(Continued)

FOREIGN PATENT DOCUMENTS

| AU | 2002329615 | 7/2002 |
| CA | 2 455 810 | 7/2005 |

(Continued)

OTHER PUBLICATIONS

Carr et al., "Reconstruction and Representation of 3D Objects with Radial Basis Functions," ACM SIGGRAPH 2001, ACM Press New York, Computer Graphics Proceedings, pp. 67-76, 2001 (ISBN 1-58113-374-X).

(Continued)

*Primary Examiner* — Hugh Jones
(74) *Attorney, Agent, or Firm* — Pearl Cohen Zedek Latzer Baratz LLP

(57) ABSTRACT

A method, apparatus and system for modeling a fault surface in a subsurface region. A direction may be determined in which a first portion of the subsurface region being on one side of the fault surface has moved relative to a second portion of the subsurface region being on the other side of the fault surface. A model of the fault surface may be generated having substantially no protrusions in the determined direction. A visualization of the model of the generated fault surface may be displayed.

21 Claims, 14 Drawing Sheets

(56) References Cited

U.S. PATENT DOCUMENTS

| | | |
|---|---|---|
| 5,844,799 A | 12/1998 | Joseph et al. |
| 5,995,907 A | 11/1999 | Van Bemmel et al. |
| 6,018,498 A | 1/2000 | Neff et al. |
| 6,106,561 A | 8/2000 | Farmer |
| 6,138,076 A | 10/2000 | Graf et al. |
| 6,151,555 A | 11/2000 | Van Bemmel et al. |
| 6,246,963 B1 | 6/2001 | Cross et al. |
| 6,278,949 B1 | 8/2001 | Alam |
| 6,353,577 B1 | 3/2002 | Orban et al. |
| 6,597,995 B1 | 7/2003 | Cornu et al. |
| 6,725,174 B2 | 4/2004 | Bouts et al. |
| 6,771,800 B2 | 8/2004 | Keskes et al. |
| 6,778,909 B1 | 8/2004 | Popovici et al. |
| 6,791,900 B2 | 9/2004 | Gillard et al. |
| 6,820,043 B2 | 11/2004 | Mallet et al. |
| 6,847,737 B1 | 1/2005 | Kouri et al. |
| 6,850,845 B2 | 2/2005 | Stark |
| 6,889,142 B2 | 5/2005 | Schonewille |
| 6,904,169 B2 | 6/2005 | Kalevo et al. |
| 7,024,021 B2 | 4/2006 | Dunn et al. |
| 7,089,166 B2 | 8/2006 | Malthe-Sorenssen et al. |
| 7,126,340 B1 | 10/2006 | Ameen et al. |
| 7,187,794 B2 | 3/2007 | Liang et al. |
| 7,227,983 B1 | 6/2007 | Christian et al. |
| 7,248,539 B2 | 7/2007 | Borgos et al. |
| 7,280,918 B2 | 10/2007 | Williams |
| 7,412,363 B2 | 8/2008 | Callegari |
| 7,418,149 B2 | 8/2008 | Dinh et al. |
| 7,446,765 B2 | 11/2008 | Dugge |
| 7,480,205 B2 | 1/2009 | Wei et al. |
| 7,523,024 B2 | 4/2009 | Endres et al. |
| 7,561,992 B2 | 7/2009 | Leflon et al. |
| 7,660,481 B2 | 2/2010 | Schaap et al. |
| 7,711,532 B2 | 5/2010 | Dulac et al. |
| 7,742,875 B2 | 6/2010 | Li et al. |
| 7,744,534 B2 | 6/2010 | Chalana et al. |
| 7,844,402 B2 | 11/2010 | Klein et al. |
| 8,010,294 B2 | 8/2011 | Dorn et al. |
| 8,065,088 B2 | 11/2011 | Dorn et al. |
| 8,150,663 B2 | 4/2012 | Mallet |
| 8,274,859 B2 | 9/2012 | Maucec et al. |
| 8,600,708 B1 | 12/2013 | Mallet et al. |
| 8,635,052 B1 | 1/2014 | Mallet et al. |
| 8,711,140 B1 | 4/2014 | Mallet |
| 8,743,115 B1 | 6/2014 | Mallet |
| 2001/0036294 A1 | 11/2001 | Keskes et al. |
| 2002/0032550 A1 | 3/2002 | Ward et al. |
| 2003/0023383 A1 | 1/2003 | Stark et al. |
| 2003/0216897 A1 | 11/2003 | Endres et al. |
| 2004/0260476 A1 | 12/2004 | Borgos et al. |
| 2004/0267454 A1 | 12/2004 | Granjeon |
| 2005/0114831 A1 | 5/2005 | Callegari et al. |
| 2005/0216197 A1 | 9/2005 | Zamora et al. |
| 2006/0004522 A1 | 1/2006 | Cacas |
| 2007/0024623 A1 | 2/2007 | Dugge |
| 2008/0021684 A1 | 1/2008 | Dulac et al. |
| 2008/0243447 A1 | 10/2008 | Roggero et al. |
| 2008/0273421 A1 | 11/2008 | Koren et al. |
| 2009/0122060 A1 | 5/2009 | Porat et al. |
| 2010/0156920 A1 | 6/2010 | Shin et al. |
| 2011/0015910 A1 | 1/2011 | Ran et al. |
| 2011/0054857 A1 | 3/2011 | Moguchaya |
| 2011/0115787 A1 | 5/2011 | Kadlec |
| 2012/0037379 A1 | 2/2012 | Hilliard et al. |
| 2012/0072116 A1 | 3/2012 | Dorn et al. |
| 2013/0204598 A1 | 8/2013 | Mallet |

FOREIGN PATENT DOCUMENTS

| | | |
|---|---|---|
| GB | 2444506 | 6/2008 |
| GB | 2444167 | 3/2011 |
| RU | 2145100 | 1/2000 |
| WO | WO 03/009003 | 1/2003 |
| WO | WO 03/050766 | 6/2003 |
| WO | WO 2006/007466 | 1/2006 |
| WO | WO 2008/005690 | 1/2008 |

OTHER PUBLICATIONS

Caumon et al. "Building and Editing a Sealed Geological Model," Mathematical Geology, vol. 36, No. 4, May 2004; pp. 405-424.

Chiles et al., "Modelling the Geometry of Geological Units and its Uncertainty in 3D From Structural Data: The Potential-Field Method," Orebody Modelling and Strategic Mine Planning, pp. 313-320, Nov. 22-24, 2004.

Cignoni et al., "Multiresolution Representation and Visualization of Volume Data," IEEE Transactions on Visualizations and Computer Graphics; 3(4), Oct.-Dec. 1997; pp. 352-369.

Clawson et al., "The Value of 3D Seismic Attributes for Illuminating Deep Water Deposits by Seismic Forward Modeling of the Brushy Canyon Formation," 2003 SEG Annual Meeting, Oct. 26-31, 2003, Dallas, Texas (only Abstract submitted).

Courrioux et al., "3D Volumetric modelling of Cadomian Terranes (Northern Brittany, France): an automatic method using Voronoi diagrams," Tectonophysics 331(1-2), Feb. 2001, pp. 181-196.

Davies, "Conditioning Poorly Sampled Gathers for Pre and Post Stack Analysis," Journal of Conference Abstracts, 2002, vol. 7, No. 2, pp. 142-143.

De Groot et al., "How to create and use 3D Wheeler transformed seismic volumes," SEG/New Orleans 2006 Annual Meeting, pp. 1038-1042.

Dorn, "Chapter 13, Interpreting 3-D Seismic Data," The Leading Edge, Sep. 1998, p. 1261-1272.

Dulac, "Advances in Chrono-Stratigraphic interpretation Modeling," First Break, vol. 27, pp. 69-72, Oct. 2009.

Durand-Riard et al., "Balanced restoration of geological volumes with relaxed meshing constraints," Computers and Geosciences, vol. 36, No. 4, pp. 441-452, Nov. 17, 2010.

Egan et al., "Three-Dimensional Modelling and Visualisation in Structural Geology: New Techniques for the Restoration and Balancing of Volumes," Proceedings of GIG Conference on Geological Visualisation—the Intelligent Picture?, British Geological Survey, Oct. 1996.

Escalona et al., Sequence-stratigraphic analysis of Eocene clastic foreland basin deposits in central Lake Maracaibo using high-resolution well correlation and 3-D seismic data, AAPG Bulletin, vol. 90, No. 4, pp. 581-623 (Apr. 2006) (only Abstract submitted).

Frank et al., "3D-reconstruction of Complex Geological Interfaces from Irregularly Distributed and Noisy Point Data," Computers & Geosciences 33 (2007) 932-943.

Frank, "Advanced Visualization and Modeling of Tetrahedral Meshes," Doctorat de l'Institut National Poly technique de Lorraine; pp. 1-140; 2006.

Gibbons, "Seismic Applications Overview," Society of Petroleum Engineers, Aug. 2003, 9 pages.

Jayr et al., "The Need for a Correct Geological Modelling Support: the Advent of the UVT-Transform," First Break, vol. 26, Oct. 2008, pp. 73-79.

Jentzsch et al., "Kinematic subsidence modelling of the Lower Rhine Basin," Netherlands Journal of Geosciences, vol. 81, No. 2, pp. 231-239 (2002).

Jones, "Data structures for three-dimensional spatial information systems in geology," Int. J. Geographical Information Systems, 3(1), 1989, pp. 15-30.

Labrunye et al., "New 3D flattened space for seismic interpretation," SEG Houston 2009 International Exposition and Annual Meeting, pp. 1132-1136.

Ledez, "Modelisation D'Objets Naturals par Formulation Implicite," Ecole Nationale Superieure de Geologie; Oct. 28, 2003; pp. 1-158, see English Abstract, (abstract considered).

Lee et al., "Pitfalls in Seismic Data Flattening," The Leading Edge, Feb. 2001, pp. 161-164.

Lepage, "Generation de Maillages Tridimensionnels Pour la Simulation des Phenomenes Physiques en Geosciences," Ecole National Superieure de Geologie; Oct. 28, 2003; pp. 1-224, see English Abstract, (abstract considered).

(56) References Cited

OTHER PUBLICATIONS

Lessenger et al., "An Inverse Stratigraphic Simulation Model: Is stratigraphic Inversion Possible?" Energy Exploration & Exploitation, vol. 14, No. 6, pp. 627-637 (1996) (only Abstract submitted), (abstract considered).

Liwanag, "Reservoir Characterisation, Introducing geological processes in reservoir models," GEO ExPro Oct. 2005, pp. 28-32.

Lixin, "Topological relations embodied in a generalized tri-prism (GTP) model for a 3D geoscience modeling system," Computers & Geosciences 30(4), May 2004, pp. 405-418.

Lomask et al., "Flattening Without Picking," Geophysics, vol. 71, No. 4, pp. P13-P20, Jul.-Aug. 2006.

Lomask et al., "Flattening Without Picking," Stanford Exploration Project, Report 112, Nov. 11, 2002, pp. 141-150.

Lomask et al., "Update on Flattening Without Picking," Stanford Exploration Project, Report 120, May 3, 2005, pp. 137-159.

Mallet, "Discrete Smooth Interpolation in Geometric Modelling," Journal of Computer Aided Design, 24(4), 1992, pp. 178-191.

Mallet, "Numerical Earth Models," 2008 EAGE Publications, ISBN 978-90-73781-63-4, p. 147-157.

Mallet, "Space-time Mathematical Framework for Sedimentary Geology," Journal of Mathematical Geology, vol. 36, No. 1, Jan. 2004, pp. 1-32.

Mallet, Geomodeling (Book chapter); Chapter 6; Oxford University Press; cover and preface pages and pp. 244-315, 2002.

Mitchum et al., "Seismic Stratigraphy and Global Changes of Sea Level, Part 6: Stratigraphic Interpretation of Seismic Reflection Patterns in Depositional Sequences," received Jan. 6, 1977, accepted Jun. 13, 1977, pp. 117-133.

Monsen et al., "Geological process controlled interpretation based on 3D Wheeler diagram generation," SEG/San Antonio 2007 Annual Meeting, pp. 885-889.

Moretti et al., "KINE3D: a New 3D Restoration Method Based on a Mixed Approach Linking Geometry and Geomechanics," Oil & Gas Science and Techonology, Rev. IFP, vol. 61 (2006), No. 2, pp. 277-289.

Rouby et al., "3-D Restoration of Complexly Folded and Faulted Surfaces Using Multiple Unfolding Mechanisms," AAPG Bulletin, vol. 84, No. 6, pp. 805-829 (Jun. 2000).

Rumpf et al., "A Continuous Skeletonization Method Based on Level Sets," Joint Europgraphics—IEEE Symposium on Visualization, pp. 151-157 (2002).

Saito, "New Algorithms for Euclidean Distance Transformation of an n-Dimensional Digitized Picture with Applications," Pattern Recognition, 27(11) 1994; pp. 1551-1565.

Samson et al., "Quantifying the Impact of Structural Uncertainties on Gross-Rock Volume Estimates", SPE 1996, pp. 381-392.

Stark, "Generation of a 3D seismic Wheeler Diagram' from a high resolution Age Volume," pp. 782-786, submitted to the 75th Annual SEG Convention, Nov. 6-11, 2005, Houston, TX.

Stark, "Relative Geologic Time (Age) Volumes—Relating Every Seismic Sample to a Geologically Reasonable Horizon," The Leading Edge, Sep. 2004, pp. 928-932.

Tertois et al., "Editing faults within tetrahedral volume models in real time," In Jolley, S.J., Barr, D., Walsh, J.J. et al. (Eds), Structurally Complex Reservoirs, London, UK: Geological Society of London, Special Publications 2007; v. 292; p. 89-101 (doi: 10.1144/SP292.5).

Tertois et al., Real-time Tetrahedral Volume Editing Accounting for Discontinuities; Ninth International Conference on Computer Aided Design and Computer Graphics (CAD/CG 2005) 2005 IEEE; pp. 1-6).

Tertois, Preserving Geological Information During Real-Time Editing of Faults in Tetrahedral Models; Int. Assoc. for Mathematic Geology Xith International Congress Universite de Liege—Belgium; 2006; S14-24; pp. 1-4.

Thomsen et al., "Towards a balanced 3D Kinematic Model of a Faulted Domain—the Bergheim Open Pit Mine, Lower Rhine Basin," Netherlands Journal of Geoscience, vol. 81, No. 2, pp. 241-250 (2002).

Thore et al., Integration of Structural Uncertainties into Reservoir grids construction—70th EAGE Conference & Exhibition—Rome, Italy, Jun. 9-12, 2008.

Wen et al., "Use of Border Regions for Improved Permeability Upscaling," Mathematical Geology, 35(5), Jul. 2003; pp. 521-547.

Wood et al., "Applying Sequence Stratigraphy and Seismic Stratal Slice Technology in the Gulf of Mexico," GASTIPS, Lang et al. (Eds.), Winter 2003, vol. 9, No. 1, pp. 10-21.

Zeng et al., High-frequency Sequence Stratigraphy from Seismic Sedimentology: Applied to Miocene, Vermilion Block 50, Tiget Shoal Area Offshoure Louisiana, AAPG Bulletin, Feb. 2004, vol. 88, No. 2, pp. (only Abstract submitted).

Zeng et al., "Interpretive Advantages of 90 Degree-Phase Wavelets: Part 2—Seismic Applications," Geophysics, SEG, vol. 70, No. 3, May 2005-Jun. 2005. pp. C-17-C-24.

Zeng et al., "Seismic Frequency Control on Carbonate Seismic Stratigraphy: A Case Study of the Kingdom Abo Sequence, West Texas," AAPG Bulletin, vol. 87, Issue No. 2, (2003) (only Abstract submitted).

Zeng et al., "Stratal Slicing of Miocene-Pliocene Sediments in Vermilion Block 50-Tiger Shoal Area, Offshore Louisiana," The Leading Edge, Offshore Technology Special Section, vol. 20, No. 4, Apr. 2001, pp. 408-418.

Zeng et al., "Stratal Slicing, Part I: Realistic 3-D Seismic Model," Geophysics, Seg, vol. 63, No. 2, Mar. 1998-Apr. 1998, pp. 502-513.

Zeng, "From Seismic Stratigraphy to Seismic Sedimentology: A Sensible Transition," GCAGS Transactions, vol. 51, (2001) (only Abstract submitted).

Zeng et al., "Stratal Slicing and Seismic Facies Imaging," Bureau of Economic Geology, The University of Texas at Austin, 1998. (only Abstract submitted).

Bakker, "Image Structure Analysis for Seismic Interpretation," doctoral thesis, publicly defended on Jun. 4, 2002 (pp. 1-132).

Caumon et al., "Elements for Stochastic Structural Perturbation of Stratigraphic Models," Proc. Petroleum Geostatistics, Sep. 10-14, 2007 (pp. 1-5).

Claerbout, "Fundamentals of Geophysical Data Processing with Applications to Petroleum Prospecting," Blackwell Scientific Publications, 1985 (pp. 1-276).

Cremeens et al., "On Chronostratigraphy, Pedostratigraphy, and Archaeological Context," Soil Science Society of America, 1995 (pp. 15-33).

Cuisenaire, "Distance Transformations: Fas Algorthms and Applications to Medical Image Processing," Laboratoire de Telecommunications et Teledetection; Oct. 1999 (pp. 1-221).

EAGE Daily News, "Paradigm is Re-defining Interpretation," May 2011 (p. 1).

"Geomodeling Releases VisualVoxAT™ 6.2 Software—Introducing the Geobody Paintbrush," New Release, Sep. 24, 2007, printed from http://www.geomodeling.com/news_22.htm; on Oct. 5, 2009 (p. 1).

Harris et al., "Fault Seal Risk Volumes—A New Tool for the Assessment of Reservoir Compartmentalisation" 71st EAGE Conference & Exhibition—Amsterdam, The Netherlands, Jun. 8-11, 2009 (pp. 1-5).

Ligtenberg et al., "Sequence Stratigraphic Interpretation in the Wheeler Transformed (Flattened) Seismic Domain," EAGE 68th Conference & Exhibition—Vienna, Austria, pp. 1-4, Jun. 12-15, 2006.

Lomask, "Flattening 3-D Seismic Cubes Without Picking," pp. 1-4, Jan. 8, 2004.

Mallet, Geomodeling, Oxford University Press, pp. 1-606, Sep. 22, 2004 (ISBN 0-19-514460.0).

Moyen et al., "3D-Parameterization of the 3D Geological Space—The Geochron Model," 9th European Conference on the Mathematics of Oil Recovery, Geological Modelling I, pp. 1-8, Aug. 30, 2004.

Moyen, "Paramétrisation 3D de L'espace en Géologie Sédimentaire: Le Modèle Geochron Thèse," Doctorat de l'Institut National Polytechnique de Lorraine, pp. 1-189, Jun. 9, 2005 (original text in French and an English translation appendix of some of the pages), translation pp. 189-222.

(56) References Cited

OTHER PUBLICATIONS

Müller et al. "3D Restoration and mechanical properties," from structure.harvard.edu/projects/restoration, Harvard University Structural Geology and Earth Resources Group, pp. 1-3 (2005).

OpendTect Workflows Documentation version 4.2, dGB Beheer B.V., dGB Earth Sciences, pp. 1-33 Copyright © 2002-2010.

Oyedele, "3D High Resolution Seismic Imaging of Middle-Late Quaternary Depositional Systems, Southeast Green Canyon, Sigsbee Escarpment, Gulf of Mexico," Thesis presented to the Faculty of the Dept. of Geosciences at the University of Houston, Aug. 2005 pp. 1-106.

Souche, "Integration of fault models into unstructured grids and geo-chronological space," $24^{th}$ GOCAD Meeting, pp. 1-11, Jun. 2004.

Terraspark Geosciences, "Geoscience Interpretation Visualization Consortium (GIVC)," http://terraspark.com/GIVC, (2006) pp. 1-5.

Zeng et al., "Stratal Slicing, Part II: 3-D Seismic Data," Geophysics, vol. 63, No. 2, pp. 514-522, (Mar.-Apr. 1998), Real.

Zeng et al., "Three-D Seismic Facies Imaging by Stratal Slicing of Miocene-Pliocene Sediments in Vermilion Block 50-Tiger Shoal Area, Offshore Louisiana," Secondary Gas Recovery, AAPG 2000, pp. 1-8 (2000).

Zeng, "Stratal Slicing: Benefits and Challenges," The Leading Edge 29, 1040, pp. 1-8, (Sep. 2010).

International Search Report issued for PCT International Application No. PCT/IB2004/002030, issued on Jan. 25, 2005, pp. 1-2.

Notice of Allowance issued for U.S. Appl. No. 11/628,559, mailed on Dec. 24, 2009, pp. 1-22.

Office Action issued for U.S. Appl. No. 11/628,559, mailed on Jun. 24, 2009, pp. 1-43.

Notice of Allowance issued for U.S. Appl. No. 12/791,370, mailed on Jul. 22, 2013, pp. 1-27.

Office Action issued for U.S. Appl. No. 12/791,370, mailed on Nov. 26, 2012 pp. 1-17.

Paradigm SKUA 2009 User Guide: Part V Seismic Interpretation Modeling. Published Feb. 3, 2009, pp. 1-177.

Tertois, "Création et édition de modèles géologiques par Champs de potential: Application au modele GeoChron—Thèse," Institut National Polytechnique de Lorraine, Jun. 21, 2007, pp. 1-170, abstract translated.

Trudgill et al., "Integrating 3D Seismic Data with Structural Restorations to Elucidate the Evolution of a Stepped Counter-Regional Salt System, Eastern Louisiana Shelf, Northern Gulf of Mexico," pp. 166-176. (2004).

GoCAD Suite 2.5 User Guide: Parts 1-12. Published Sep. 15, 2007, pp. 1-2802.

Notice of Allowance issued for U.S. Appl. No. 12/791,352, mailed on Dec. 6, 2013, pp. 1-25.

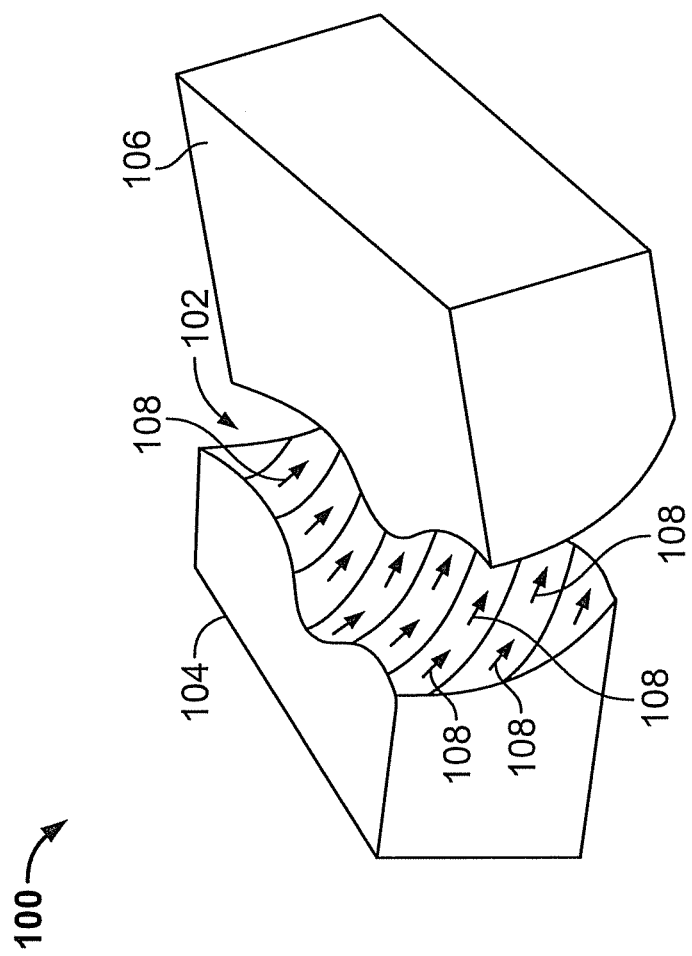
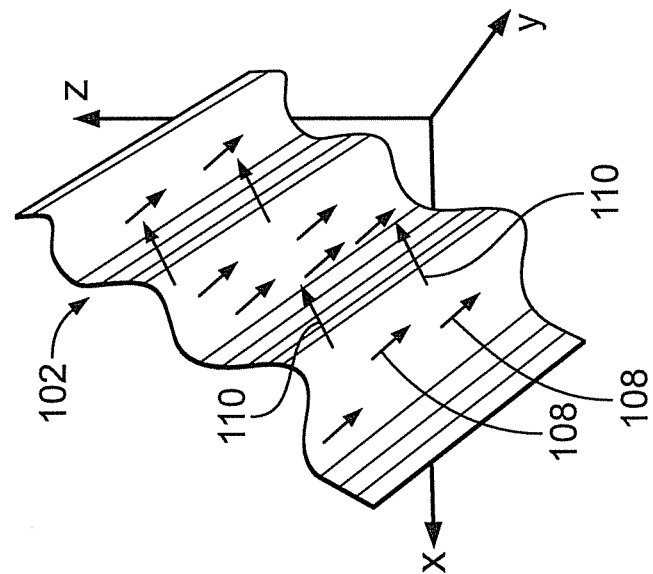
FIG. 1A
FIG. 1B

SYSTEMS AND METHODS FOR MODELING FAULTS IN THE SUBSURFACE

CROSS-REFERENCE TO RELATED APPLICATIONS

This application is a continuation of U.S. application Ser. No. 12/791,483, filed Jun. 1, 2010, which claims the benefit of prior U.S. Provisional Application Ser. No. 61/182,843, filed Jun. 1, 2009, both of which are incorporated by reference herein in their entirety.

FIELD OF THE INVENTION

The invention pertains to the general field of modeling networks of faults in the subsurface. More precisely, new techniques are proposed for modeling a consistent network of fault surfaces. Contrary to other methods, embodiments of the proposed new methods may embed objects with dimension of for example up to two, such as sets of points, lines and triangulated surfaces, in a three-dimensional volume by computing level sets. Moreover, embodiments of the proposed modeling technique may allow hard and soft data to be integrated for a given fault and allow information pertaining to relationships between faults to be identified, edited and correctly modeled.

BACKGROUND OF THE INVENTION

In a subsurface terrain, there are many types of faults, for example, branching faults, crossing faults, parallel faults, etc. Faults often appear "fuzzy" or "blurred" on seismic cross sections or in seismic cubes. The exact location of faults may be uncertain and thus, it may be difficult to position faults at an exact location in a 3D geological model displayed to a user.

Faults are generally observed and sampled on seismic cross sections or automatically extracted from seismic data. Uncertainties in the seismic data often provide modeled faults that are unrealistic or inconsistent with other data. For example, when a fault fractures a geological structure, geological layers or terrains on either side of the fault slide relative to each other. However, conventional modeling tools may generate a protrusion (e.g., a bump) on the modeled fault surface. Such a protrusion would have prevented the fault from forming by obstructing relative sliding of terrains on either side of the fault. Therefore, the model of the fault is incorrect.

Accordingly, there is a great need in the art for a mechanism to accurately model the location and geometry of faults.

SUMMARY OF THE INVENTION

Embodiments of the invention provide a system and method for modeling a geological subsurface including faults and fault networks.

In one embodiment of the invention, a computing system may model a fault surface in a subsurface region. A direction may be determined in which a first portion of the subsurface region being on one side of the fault surface has moved relative to a second portion of the subsurface region being on the other side of the fault surface. A model may be generated of the fault surface having substantially no protrusions in the determined direction. A visualization of the model of the generated fault surface may be displayed.

In one embodiment of the invention, a computing system may, in a subsurface modeled domain, model a plurality of fault surfaces that are substantially parallel. A plurality of sets of sampling points may be received. Each set of sampling points may correspond to a different one of the plurality of fault surfaces. A three-dimensional scalar field may be generated to represent sampling points from each of the plurality of sets. A model of the plurality of fault surface models may be simultaneously generated by applying a continuous operation throughout the three-dimensional scalar field. The plurality of fault surface models may be displayed together in the subsurface modeled domain.

In one embodiment of the invention, a computing system may determine a relationship between fault surfaces in a subsurface region. A plurality of predetermined criteria may be set. Each criterion may correspond to one of a plurality of types of relationships between two or more fault surfaces. Each predetermined criterion typically relates to the spatial coincidence of one fault with another. It may be determined that the two or more fault surfaces have a relationship type that corresponds to one of the predetermined criteria that is met by the spatial coincidence of the two or more fault surfaces. The relationship type may be stored as data associated with the two or more fault surfaces.

In one embodiment of the invention, a computing system may model branching fault surfaces in a subsurface region. A value may be received of an angle at which the two or more modeled fault surfaces are to intersect relative to each other. A value may be received of a distance from the intersection of the faults along which the two or more modeled fault surfaces are to have the received value of the angle. A model of branching fault surfaces may be generated, in which the branching fault surfaces intersect at an angle approximately equal to the received angle value, and the angle between the branching fault surfaces is approximately equal to the received angle value for a distance along the branching fault surfaces approximately equal to the received distance. The model of the branching fault surfaces may be displayed.

In one embodiment of the invention, a computing system may translate faults in a subsurface model. A plurality of faults may be generated in a first model using data relating to spatial coincidence of one fault with another, where each fault is positioned at an initial location. One or more altered locations may be generated each corresponding to a position of one or more faults in the second model. The altered locations corresponding to the position of the one or more faults in the second model may be different than the initial location corresponding to the one or more faults in the first model. The second model may be generated to include the one or more translated faults positioned at the altered location and the remaining faults in the plurality of faults positioned at their initial location in the first model.

BRIEF DESCRIPTION OF THE DRAWINGS

The principles and operation of the system, apparatus, and method according to embodiments of the present invention may be better understood with reference to the drawings, and the following description, it being understood that these drawings are given for illustrative purposes only and are not meant to be limiting.

FIGS. 1A and 1B are schematic illustrations of a model of a fractured subsurface region and a fault surface by which the subsurface region is fractured, respectively, according to an embodiment of the invention;

Figure 1C:
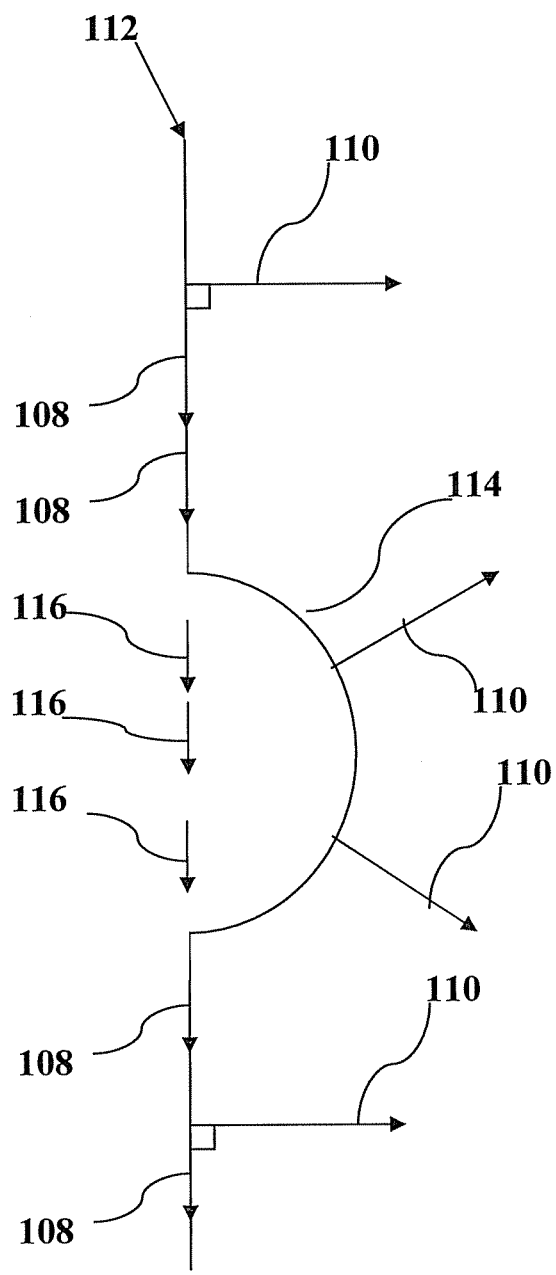
FIG. 1C is a schematic illustration of a cross-section approximately orthogonal to geological horizons of an impermissible fault surface having a protrusion.

For simplicity and clarity of illustration, elements shown in the drawings have not necessarily been drawn to scale. For example, the dimensions of some of the elements may be exaggerated relative to other elements for clarity. Further, where considered appropriate, reference numerals may be repeated among the drawings to indicate corresponding or analogous elements throughout the serial views.

DETAILED DESCRIPTION

For simplicity and clarity of illustration, embodiments of the invention are described in two main sections herein (elements and embodiments from each may of course be combined in some embodiments).

The first section, entitled "Generating a Computer Representation of a Fault," describes, inter alia, mechanisms which may be used according to embodiments of the present invention to generate a single fault (e.g., to generate data representing a modeled fault) based on the geometric behavior of faults.

The second section, entitled "Generating a Consistent Fault Network," describes, inter alia, mechanisms which may be used according to embodiments of the present invention to compose a plurality of faults to generate a consistent fault network.

For the sake of clarity and for the purpose of simplifying the presentation of embodiments of the invention, the following preliminary definitions are given, although other definitions may be used:

Geological-Time

A particle of sediment in a geological terrain may be observed at a location in the subsurface. The location of the particle may be mathematically represented or modeled, e.g., by a vector, (x,y,z), in a three-dimensional (3D) space, such as the Cartesian coordinate system (of course, when modeling such particles, the position of many particles may be modeled together as for example a cell). When modeled, a data structure such as a node or cell may represent particles. The time when the particle of sediment was originally deposited may be referred to as the "geological-time" and may be represented or modeled, e.g., as a geological-time function of the current location of the particle, t(x,y,z). When used herein, a "current" location for a particle (or data structure representing one or more particles) or subsurface feature may mean the location of the item in the present day, relative to geological time. The actual geological-time of the deposition of particles may be difficult to determine and may be replaced, e.g., by any arbitrary monotonic increasing function of the actual geological-time. The monotonic function may be referred to as the "pseudo-geological-time". Geological-time and pseudo-geological-time are referred to interchangeably herein.

Horizon, Fault and Unconformity

In stratified layers, horizons, faults and unconformities may be curvilinear surfaces which may be for example characterized as follows.

A horizon, H(t), may be a surface corresponding to a plurality of particles of sediment which were deposited approximately at substantially the same geological-time, t.

A fault may be a surface of discontinuity of the horizons that may have been induced by a relative displacement of terrains on both sides of such surfaces. In other words, the geological-time (t) of deposition of the sediments is discontinuous across each fault. Faults may cut horizons and may also cut other faults.

An unconformity may be a surface of discontinuity of the horizons that may have been induced by for example an erosion of old terrains replaced by new ones. In other words, similarly to faults, the geological-time (t) of deposition of the sediments is discontinuous across each unconformity. When discussed herein, unconformities are treated as faults: as a consequence, in this patent application, faults may include both real faults and unconformities. Alternatively, unconformities may be surfaces that bound a plurality of sedimentary layers, where a sequence of the sedimentary layers may be associated with a single geological time of deposition.

Level Set

A function, f(x,y,z), such as a function of geological-time, may be defined in a 3D space. The function may be monotonic, i.e., the gradient of the function never vanishes and the function has no local maximum or minimum values. A level set may be the set of points where the function, f(x,y,z), is equal to a given numerical value, $f_0$. Therefore, if the function is the geological-time t(x,y,z), then a level set of t(x,y,z) may be a geological horizon.

Sampling-Points

Each fault F may be defined by a set of a plurality of sampling points $F_{SP}=\{p_1, p_2, \ldots, p_n\}$. Sampling point data may be initially collected, e.g., as seismic data, and then processed by known seismic interpretation tools. Sampling points may be automatically generated by computing systems and/or manually selected by a user. The sampling points may be approximated or interpolated, as much as possible, for example, using known numerical modeling techniques.

Discrete-Smooth-Interpolation (DSI)

Discrete-Smooth-Interpolation (DSI) is a method for interpolating or approximating values of a function f(x,y,z) at nodes of a 3D mesh, M, while honoring a given set of constraints. The DSI method allows properties of structures to be modeled by embedding data associated therewith in a (e.g., 3D Euclidean) modeled space. The function f(x,y,z)

may be defined by values at the nodes of the mesh, M. The DSI method allows the values of f(x,y,z) to be computed at the nodes of the mesh, M, so that a set of one or more (e.g., linear) constraints are satisfied.

Constraints are typically classified by one of the following types:
1) "Soft" constraints may require the function f(x,y,z) to approximate a constraint. For example, a soft constraint may be that f(x,y,z) takes a given value at a given sampling point. Since this constraint is "soft", f(x,y,z) may take a least squares approximation of the given value;
2) "Hard" constraints may require that the function f(x,y,z) exactly honors the constraints. For example, a hard constraint may include inequality constraints; and
3) "Smoothness" constraints may require that the function f(x,y,z) varies as smoothly as possible while honoring the soft and hard constraints.

Examples of DSI constraints include, for example:
The Control-Point constraint which may require that, at a given location $(x_0,y_0,z_0)$ the value of $f(x_0,y_0,z_0)$ is equal to a given value $f_0$;
The Control-Gradient constraint specifying that, at a given location $(x_0,y_0,z_0)$ the gradient of $f(x_0,y_0,z_0)$, $(\nabla fx_o, \nabla fy_o, \nabla fz_o)$, is equal to a given vector $G_0$;
The Gradient-Direction constraint specifying that, at a given location $(x_0,y_0,z_0)$ the gradient of $f(x_0,y_0,z_0)$, $(\nabla fx_o, \nabla fy_o, \nabla fz_o)$, is parallel to a given vector $D_0$;
The Projected-Gradient constraint specifying that, at a given location $(x_0,y_0,z_0)$ the gradient of $f(x_0,y_0,z_0)$, $(\nabla fx_o, \nabla fy_o, \nabla fz_o)$, is orthogonal to a given vector
The Average-Gradient constraint specifying that, on a given set of points, the average of the gradient of f(x,y,z) is equal to a given vector; and
The Delta constraint specifying that, given two locations $(x_0,y_0,z_0)$ and $(x_1,y_1,z_1)$ in the studied domain, the difference between $f(x_0,y_0,z_0)$ and $f(x_1,y_1,z_1)$ may either be equal to, lesser than, or greater than, a given value D.

Fault-Blocks and Throw Vectors

Fault blocks correspond to regions of the subsurface that were originally deposited in substantially the same region of the subsurface, and that have since moved relative to each other in a direction along a fault surface. A "throw-vector" may be a vector, e.g. $T(x_f,y_f,z_f)$, which has a direction tangent to a fault surface and a magnitude corresponding to the displacement of fault blocks relative to each other.

Fault striae may include linear or curved grooves formed when a first fault block on one side of a fault surface slides against a second fault block on the other side of the fault surface. At any point (q) on a fault surface F, there may be a stria and a throw vector T(q) tangent to the fault surface. If a unit normal vector N(q) is orthogonal to the fault surface F at the point (q), then the unit normal vector N(q) is likewise orthogonal to throw vector T(q). For example:

$$T(q) \cdot N(q) = 0 \text{ for any point } (q) \text{ on the fault surface } F \quad (A)$$

where the symbol "·" represents the dot product operator.

To generate a geometric model of the fault surface F, a set of sampling points $F_{SP} = \{p_1, p_2, \ldots, p_n\}$ located on the fault surface F may be used, for example, when:

$$p_i \text{ belongs approximately to the fault surface } F \text{ for all } (p_i) \text{ in the set } F_{SP} \quad (B)$$

Figure 7:
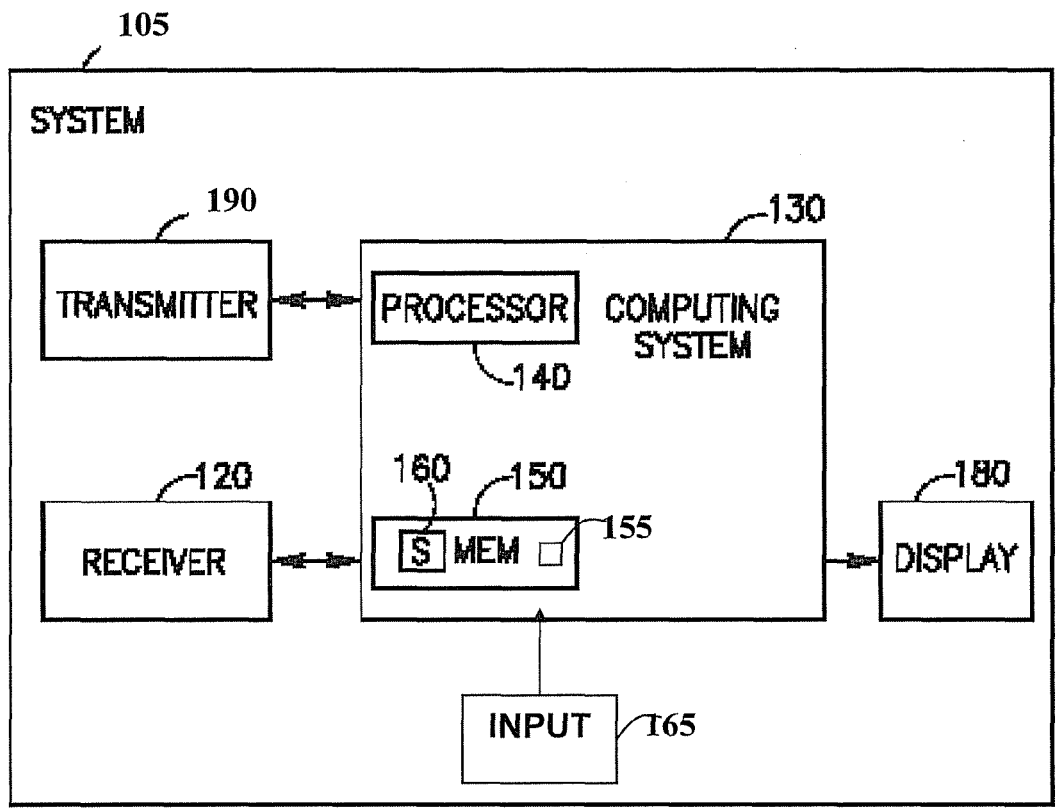
FIG. 7 is a schematic illustration of a system according to an embodiment of the invention.

When used herein, "generating" or "creating" a model or a subsurface feature may include creating data representing the model or feature, the data being stored for example in a computer system such as that shown in FIG. 7. To model the geometry of a fault surface, principles of rigid body mechanics may be used, in which a vector field of the cinematic velocity T(q) of a particle located at a point (q) in a solid (i.e., a unit vector tangent to the trajectory of the particle) satisfies the following well known "Varignon equation":

$$T(q) = T_0 + (q - q_0) \times R \quad (C)$$

In equation (C):
$q_0$ denotes a point selected arbitrarily in the 3D space;
$T_0$ denotes an unknown constant vector equal to $T(q_0)$ at location $q_0$;
R denotes an unknown constant vector equal to the rotational or curl of the vector field T(q) (e.g., a vector which characterises the rotation of a vector field T(q)); and
the symbol "×" represents the cross product operator.

The vectors $T_0$ and R may be determined so that a field of throw vectors T(q) associated with a fault surface F is tangent to the fault surface at any point (q) located on the fault surface. A process may proceed as follows:

1. Represent the geometry of fault surface F by a "B-spline" surface having parametric equations, defined as follows:

$$x(u,v) = B_1(u,v) \cdot x_1 + B_2(u,v) \cdot x_2 + \ldots + B_m(u,v) \cdot x_m \quad (D)$$

where:
x(u,v) is a point on F in a 3D modeling space;
(u,v) are scalar parameters;
m>4 is a given integer called the "degree of the B-spline";
The scalar coefficients $\{B_1(u,v), B_2(u,v), \ldots, B_m(u,v)\}$ are given functions called "B-spline blending functions";
Points $CN = \{x_1, x_2, \ldots, x_m\}$ are "control-points" whose location in the 3D space completely determine the shape of the fault surface F; and
The symbol "·" represents the product of a scalar and a vector.

2. Determine the vectors $(T_0)$ and (R) and the location of the points $CN = \{x_1, x_2, \ldots, x_m\}$ so that a given objective function $Q(T_0, R, CN)$ is minimized.

The objective function $Q(T_0, R, CN)$ may be selected to minimize a sum of positive quadratic terms that measure errors, as follows:
a first positive quadratic term measures an average distance of the fault surface F to sampling data points in $F_{SP}$;
a second positive quadratic term measures an average sum of the square of the main curvatures of the fault surface F;
a third positive quadratic term measures an average violation of the equation (A); and
a fourth positive quadratic term measures a deviation, on average, of T(q) from a unit vector.

The objective function $Q(T_0, R, CN)$ so defined is highly non-linear (e.g., having terms of order two or greater). A problem may be that there are infinitely many possible solutions for $T_0$, R and CN. To simplify the solution of the geometry of fault surface F, a set of points $FQ = \{x(u_1,v_1), x(u_2,v_2), \ldots, x(u_n,v_n),\}$ may be selected on the fault surface F so that each point $x(u_i,v_i)$ in CN is associated with a point $(p_i)$ in $F_{SP}$. There are several drawbacks to this approach, for example, including:
the final model for the fault surface F is highly dependent on the initial choice of the parameters $(u_i,v_i)$ characterizing each point $x(u_i,v_i)$ associated with a sampling data point $(p_i)$ of the set $F_{SP}$;

there is no method to select the parameters $(u_i,v_i)$ automatically and, therefore, these parameters may be selected manually by users;

there is no method to incorporate other fault parameters such as, for example, the parallel nature of faults or an angle of intersection between neighboring or crossing faults.

As a consequence, this method is impractical for use in industrial geological modeling applications where there are often hundreds of faults with complex shapes. Therefore, there is a need in the art for a method of modeling a fault surface without these drawbacks.

In some embodiments of the invention, a fault surface may be modeled by a fully automatic process that, e.g., satisfies equations (A) and (B). Moreover, embodiments of the invention enable additional information, e.g., the type of relationships between faults, to be satisfied when modeling a plurality of faults.

In one embodiment of the invention, the aforementioned process may be adapted, for example, as follows (other operations or series of operations may be used, and the exact set of steps shown below may be varied):

Replace the "explicit" equation (D) by the following "implicit" equation (E) where (x,y,z) are the coordinates of any arbitrary point in the 3D modeled space, $f(x,y,z)$ may be a scalar function and $f_0$ may be a constant:

$$f(x,y,z)=f_0 \quad (E)$$

where (x,y,z) may represent the coordinates of a point, which is not located on the fault to be modeled.

Equation (A) may be satisfied and, e.g., taken into account as a linear DSI constraint on the function $f(x,y,z)$ in which the gradient of the function $f(x,y,z)$ is orthogonal to $T(x,y,z)$;

Equation (B) may be satisfied and, e.g., taken into account as a linear DSI constraint on the function $f(x,y,z)$, in which, for any sampling data location $(p_i)$ with coordinates $(x_i, y_i, z_i)$, the function $f(x_i, y_i, z_i)$ is approximately equal to a given constant $f_0$;

Generate an initial version $f^*(x,y,z)$ of the scalar function, $f(x,y,z)$, that satisfies equation (B), e.g., using the Discrete-Smooth-Interpolation (DSI) method described herein;

Compute an approximation of the vector field $T(q)$ using the initial function $f^*(x,y,z)$, e.g., using the DSI method; and Generate a subsequent or final solution to the scalar function $f(x,y,z)$ satisfying equations (A) and (B) and, optionally, satisfying additional information relating to the relationships between neighboring or crossing faults, e.g., using the DSI method.

A fault network may be generated to model faults in reservoirs. Faults typically displace geological terrains and may disrupt or facilitate the fluid flow between reservoirs, for example, by separating or connecting the reservoirs, respectively. Accurate fault modeling is important to understand the structure of reservoirs and enable optimal hydrocarbon recovery.

Several current software packages provide tools for fault modeling:

Schlumberger's Petrel software generates fault networks from fault sticks interpreted from seismic data. This software cannot model complex fault shapes and networks automatically and requires intensive manual editing.

GOCAD® software generates and edits surfaces composed of sets of triangles. This approach often requires manual editing and, contrary to some embodiments of the present invention, does not incorporate information about the geometry of faults, e.g., the geometric relationships between intersecting faults.

Roxar software uses a fused fault block approach to create geological models. For each fault, a surface plot is generated from available data. This plot is a function z' of a 2D frame of reference (x', y') which is rotated to allow the best possible projection of fault data onto the (x',y') plane. Sampling points are evaluated for the function z' and are then smoothed to generate a modeled fault using a 2.5D approach. A 2.5D approach generates a model in 2D and adds an "elevation" parameter. Although such a model may be viewed in a 3D space, the data in the model is not fully 3D, e.g., since multi-valued surfaces, for example an "S" shaped surface, cannot be modeled without losing information relating to the surface curvature. The modeled fault may be extended and the modeling volume is then split into two parts. This approach can only be used to model surfaces which may be projected onto a plane. Furthermore, even fault surfaces that may be projected onto a plane (e.g., without overlaps) may be numerically imprecise in regions of the fault surface where the function z' approximates the tangent to the fault surface.

Embodiments of the present invention may model fault surfaces having more complex shapes than for example the Roxar software, since embodiments of the invention do not project fault surfaces onto a plane. For example, embodiments of the invention may model a closed boundary of a salt bubble, considered to be a discontinuity and thus handled as a fault. Furthermore, embodiments of the invention may automatically and virtually (not explicitly) divide the modeling volume into, for example, three parts to generate a fault model, for example: the fault surface itself, a volume on one side of the fault surface and a volume on the other side of the fault surface.

Similar to GOCAD® software, some conventional systems compute truncations where faults cross each other. Intersections are identified as "lines where two faults share the same set of points." Parts of faults on one or the other side of intersections may be eliminated according to user input or automatically by a computing device based on a comparison of the area of the truncated parts.

In contrast and contrary to other software, embodiments of the present invention use scalar fields and level sets to compute intersection points or lines and to model a fault based on the relationship between the intersecting faults, e.g., as described in the section entitled "Determining a Type of Relationship Between Faults $F_a$ and $F_b$" and "Automatic Restoration of Structural Coherency".

Other conventional systems describe, after each fault has been modeled and extended to split the volume in two parts, that a fused fault block approach may be used to re-groups fault blocks bounded by fault extensions when no actual fault exists between the fault blocks. A "binary tree" may be generated to represent faults as nodes of the tree, fault blocks as "leaves" of the tree, and truncation rules are used to extend the branches of the tree. This approach typically fails when two faults fully cross in an "X" pattern.

In contrast, embodiments of the present invention typically do not provide a hierarchical representation of faults. Faults that cross in an "X" pattern may be represented simply as one of a plurality of types of faults, in which neither of the intersecting faults is a main fault or a secondary fault.

Furthermore, embodiments of the invention use 3D scalar fields instead of the 2.5D approach of the Roxar software. Accordingly, embodiments of the invention may determine, for any point p modeled in the 3D space, on which side of every fault the point is located. As a consequence, some embodiments of the invention typically do not use a separate step to generate fault blocks.

Other conventional systems describe generating a geological model using level sets. Several scalar fields may be computed from geological interface data such as point sets on a topographic surface and dip angles. A user defines a stratigraphic column which determines how the different scalar fields interact, e.g., if one structure erodes another. Faults may be modeled by introducing "drifts" into the approximation function that represents horizons to simulate a discontinuity. This method provides neither a geometrical representation of the fault surfaces nor a method to build these surfaces.

In contrast, some embodiments of the invention typically use scalar fields and level sets to model faults, not horizons, and automatically integrates input data to generate 3D models that may be edited.

Generating a Computer Representation of a Fault

According to an embodiment of the invention, a subsurface structure fractured by a fault surface may be modeled as a computer representation. Reference is made to FIGS. 1A and 1B, which schematically illustrate a model of a fractured subsurface region 100 and a fault surface 102 by which the subsurface region is fractured, respectively, according to an embodiment of the invention. The modeled fault surface 102 may be mathematically represented by a scalar function $f(x,y,z)$. The value of the scalar function $f(x,y,z)$ at a point located on fault surface 102 is typically a constant value, $f_0$, for example, zero (0). In some embodiments of the invention, the function $f(x,y,z)$ represents the signed distance to modeled fault surface 102. As with other models of subsurface features, functions, and other data described herein used to model and display such features, the data representing these models, functions and other data (e.g., nodes) may be stored in and manipulated by a computer system, such as that shown in FIG. 7.

Each fault surface 102 may be represented by a triplet (f, $f_0$, FS), where FS is a surface patch corresponding to fault surface 102 and $f(x,y,z)$ is a scalar function which takes on a value $f_0$ for any point $(x,y,z)$ in the model located on the surface patch FS. For example:

If $(x,y,z)$ is a point on the surface patch $FS ==>$ then
$$f(x,y,z)=f_0 \quad (1)$$

The function $f(x,y,z)$ is typically defined throughout a 3D geological space in which its value may be $f_0$ for points $(x,y,z)$ located on FS and may also be $f_0$ for points $(x,y,z)$ not located on FS. In practice, the function $f(x,y,z)$ may partition the 3D geological space into three types of regions for each fault:

A surface $FS_0$ where scalar function $f(x,y,z)$ (e.g., the distance to the fault) is equal to the given constant $f_0$:

$$(x,y,z) \text{ belongs to } FS_0 <==> f(x,y,z)=f_0 \quad (2)$$

The surface $FS_0$ is typically located on fault surface 102.

A region $FS_+$ where the difference $\{f(x,y,z)-f_0\}$ between the value of the function $f(x,y,z)$ at a point $(x,y,z)$ in the region and the given constant $f_0$ is positive; this region may be referred to as the "positive" side of $FS_0$:

$$(x,y,z) \text{ belongs to } FS_+ <==> f(x,y,z)-f_0>0 \quad (3)$$

The region $FS_+$ is typically located on a first side of fault surface 102, e.g., a "positive" side $F_+$ 106.

A region FS− where the difference $\{f(x,y,z)-f_0\}$ between the value of the function $f(x,y,z)$ at a point $(x,y,z)$ in the region and the given constant $f_0$ is negative; this region may be referred to as the "negative" side of $FS_0$:

$$(x,y,z) \text{ belongs to } FS- <==> f(x,y,z)-f_0<0 \quad (4)$$

The region FS− is typically located on a second side of fault surface 102, e.g., a "negative" side F− 104.

Accordingly, the surface $FS_0$ typically includes the surface patch FS:

$$FS \text{ belongs to } FS_0 \quad (5)$$

In a preferred embodiment of the invention, the function $f(x,y,z)$ may represent a "signed distance" of the surface $FS_0$ where $f(x,y,z)$ may be the smallest distance between a modeled point $(x,y,z)$ and the surface $FS_0$ and may be positive or negative when the modeled point $(x,y,z)$ is on the first or second side of fault surface 102, respectively. In a preferred embodiment, the value $f_0$ of the function $f(x,y,z)$ for points $(x,y,z)$ located on the fault may be zero, although any other value may be used.

It may be appreciated by persons of skill in the art that the function $f(x,y,z)$ may be differently defined to achieve similar results. For example, if $f\_old(x,y,z)$ denotes the function $f(x,y,z)$ defined according to the aforementioned description, then $f(x,y,z)=f\_old(x,y,z)$ may be replaced by a new function denoted $f\_new(x,y,z)$. For example, $f\_new(x,y,z)$ may be a rescaled version of $f\_old(x,y,z)$, such that:

$$f\_new(x,y,z)=g\{f\_old(x,y,z)\}$$

$$f0\_new=g(f0\_old)$$

where g may be an arbitrary monotonic function.

If such a rescaling is applied, equations (1) to (5) remain valid provided that $f(x,y,z)$ and $f_0$ are re-defined, for example, according to the following equations:

$$f(x,y,z)=f\_new(x,y,z)$$

$$f_0=f_{0\_new}$$

Each fault surface 102 may be defined by a set of a plurality of sampling points $F_{SP}=\{p_1, p_2, \ldots, p_n\}$. Sampling point data may be initially collected, e.g., as well data or seismic data, and then processed by seismic interpretation tools, e.g., known in the oil and gas industry. The sampling points may be approximated or interpolated, as much as possible, for example, using known numerical modeling techniques.

Modeling a Function $f(x,y,z)$ for a Single Fault F

According to one embodiment of the invention, a function $f(x,y,z)$ may be generated to represent a model of fault surface 102. The function $f(x,y,z)$ may be approximated at the nodes of a given mesh so that $FS_0$ approximates the sampling-points contained in $F_{SP}$, as much as possible. In an embodiment of the invention, an average normal vector may be generated from the set of sampling-points $F_{SP}$ and used to define the function $f(x,y,z)$ at the nodes of a given mesh. For example, the following steps may be used (other operations or series of operations may be used, and the exact set of steps shown below may be varied):

1) Cover a 3D geological domain by a mesh M. Mesh M may be composed of cells, faces, edges, and vertices (e.g., nodes) arranged for example as a regular or irregular array, lattice or grid. In a preferred embodiment, the cells may be shaped as tetrahedron or hexahedron cells, although other shapes may be used.

2) The function f(x,y,z) may be defined by its values sampled at the nodes of mesh M. For any point (x,y,z) of the model, which is not a node of M, the value of f(x,y,z) at the point (x,y,z) may be generated, e.g., locally approximated, from the value of f(x,y,z) at neighboring nodes. For example, the value of f(x,y,z) at the point (x,y,z) may be locally approximated by a linear approximation.

3) Set a value $f_0$ to be the value of the function f(x,y,z) at points belonging to $FS_0$. This value $f_0$ may be any arbitrary real number. For example, the value $f_0$ may be zero, although any other real number may be used.

4) For each sampling-point (p) in the set $F_{SP}$ (e.g., represented by coordinates $(x_p, y_p, z_p)$), set the value of the function $f(x_p, y_p, z_p)$ at the sampling-point (p) equal to $f_0$. For example, if the DSI method is used to approximate f(x,y,z) at the nodes of mesh M, then a DSI-Control-Point constraint may be installed specifying that the function $f(x_p, y_p, z_p)$ at the sampling-points is equal to $f_0$.

5) Generate a matrix [Q] initialized to be, for example, a 3×3 null matrix.

6) For each sampling-point (p) in the set $F_{SP}$ (e.g., represented by coordinates $(x_p, y_p, z_p)$), add a matrix [Q(p)] to [Q], where matrix [Q(p)] is, for example, a 3×3 matrix defined as follows:

$$[Q(p)] = \begin{bmatrix} x_p \\ y_p \\ z_p \end{bmatrix} \bullet \begin{bmatrix} x_p & y_p & z_p \end{bmatrix}$$

where the symbol "·" represents the dot product operator.

7) Compute the unit Eigen vectors $\{E_1, E_2, E_3\}$ and corresponding Eigen values $\{e_1, e_2, e_3\}$ of the matrix [Q] generated in step (6). Order the Eigen values so that $e_1 \geq e_2$ and $e_2 \geq e_3$.

8) Set the Eigen vector $E_3$, which corresponds to the smallest Eigen value $e_3$ to be the average normal of the set of sampling-points $F_{SP}$.

9) Set the average gradient of the function $f(x_q, y_q, z_q)$ equal to $E_3$. For example, if the DSI method is used to approximate f(x,y,z) at the nodes of mesh M, then a DSI-Average Gradient constraint may be installed specifying that the average of the gradient of the function $f(x_q, y_q, z_q)$ is equal to $E_3$.

10) Optionally, for each sampling-point (p) in the set $F_{SP}$, set the gradient $Gf(x_p, y_p, z_p)$ of the function f(x,y,z) at the sampling point $(x_p, y_p, z_p)$ to be orthogonal to a vector field T(x,y,z) of throw vectors. For example, if the DSI method is used to approximate f(x,y,z) at the nodes of mesh M, since the dot product of orthogonal vectors is zero, install a (e.g., "soft") constraint specifying that, the dot product of the gradient $Gf(x_p, y_p, z_p)$ and the vector field $T(x_p, y_p, z_p)$ is as close to zero as possible. Note that only the direction of the vector field $T(x_p, y_p, z_p)$ may be required in the computation of such a constraint. Note also that such a constraint allows the intrinsic geological behavior of a fault to be taken into account.

11) If the set of sampling-points, $F_{SP}$, includes geometrical information in addition to the modeled locations of the sampling-points (p), use this information as constraints on the function f(x,y,z), for example, as follows:
  a. If $F_{SP}$ includes lines then for each sampling point p where line information is available:
    i. Compute a vector tg(p) that is a tangent vector to the line at node p; and
    ii. Install a constraint on node p specifying that the gradient of the function f(x,y,z) at node p is orthogonal to the vector tg(p).
  b. If $F_{SP}$ includes surface patches then for each sampling point p where surface information is available:
    i. Compute a vector n(p) that is a normal to the surface patch at node p; and
    ii. Install a constraint on node p specifying that the gradient of the function f(x,y,z) at node p is collinear to n(p) or equal to n(p)/‖n(p)‖ if the function f(x,y,z) is a signed distance map of the set $F_{SP}$ associated with a constant $f_0$, e.g., equal to zero (0).

12) For each node p of mesh M, a smoothness constraint may be applied specifying that the function f(x,y,z) varies smoothly in the 3D geological domain, e.g., while honoring the constraints in the steps above. As a non-limiting example, if the DSI method is used, a "smoothness constraint" may be used, defined in the neighborhood of each node (p) of the mesh M, for example, by one or more of the following (other constraints may be used):
  a. Smoothness constraint #1: In the neighborhood of (p), the gradient of the function f(x,y,z) is constrained to be as constant as possible; and
  b. Smoothness constraint #2: In the neighborhood of (p), the function f(x,y,z) is constrained to vary linearly, as much as possible.
  If value $f_0$ is set to zero, using smoothness constraints #1 or #2, the function f(x,y,z) may be a signed distance map to sampling points $F_{SP}$.

13) Use the DSI method or another equivalent method to compute the values of the function f(x,y,z) at the nodes of mesh M, e.g., while honoring all the constraints specified in the steps above.

14) Stop

Figure 2:
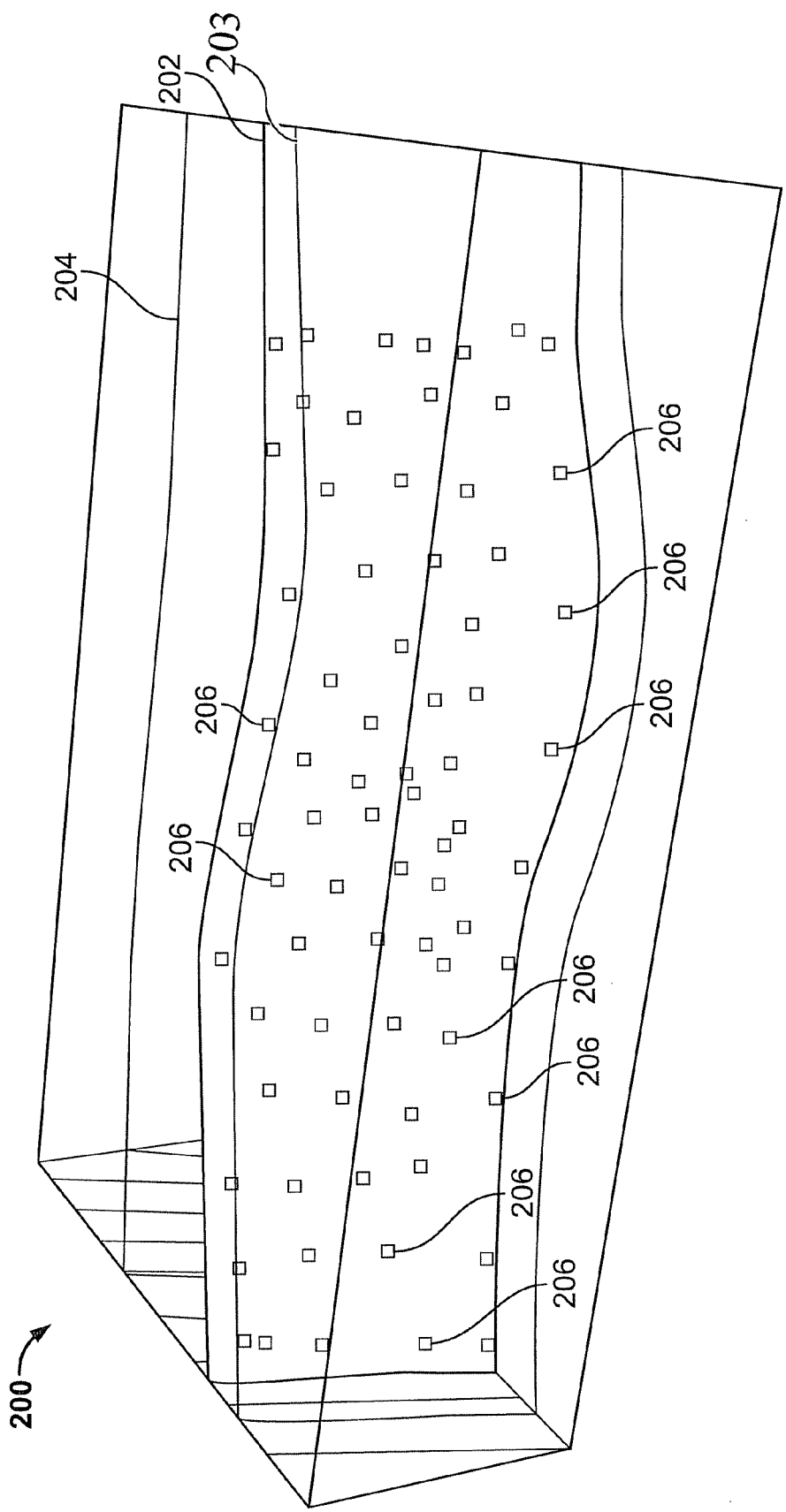
FIG. 2 is a schematic illustration of a fault having a plurality of level surfaces modeled according to an embodiment of the invention.

Reference is made to FIG. 2, which schematically illustrates a model 200 including fault 202 generated according to embodiments of the invention. Fault 202 is a level set corresponding to the value $f_0$ of function f(x,y,z) that approximates a set $F_{SP}$ of sampling points 206 modeled according to an embodiment of the invention. Model 200 includes two additional level sets 203 and 204 corresponding to two other values of the function f(x,y,z), that are greater than $f_0$ and less than $f_0$, respectively.

In FIG. 2, for the sake of clarity:
  sampling-points 206 belonging to the set $F_{SP}$ are represented by small cubes;
  level set $FS_0$ representing fault 202 approximates the set of sampling points $F_{SP}$; and
  level sets 203 and 204 of function f(x,y,z) are drawn in front and behind fault 202, respectively.

Fault-Blocks and Throw Vectors

Faults may include surfaces corresponding to fractures in the subsurface terrain. In FIGS. 1A and 1B, subsurface region 100 includes a first fault block 104 and a second fault block 106 located along opposite sides of fault surface 102. First and second fault blocks 104 and 106 correspond to regions of the subsurface that were originally deposited in substantially the same region of the subsurface, and that have since moved relative to each other in a direction along fault surface 102 at each modeled location $(x_f, y_f, z_f)$ on fault surface 102. A "throw-vector" 108 may be a vector, $T(x_f, y_f, z_f)$, which is tangent to fault surface 102 and corresponds to the direction of displacement of fault blocks 104 and 106 relative to each other. Typically the direction and not the magnitude of a throw-vector defines the geometry of fault surface 102.

Fault surface 102 may have a geometry defined so that adjacent surfaces of fault blocks 104 and 106 were in contact before the terrains on either side of fault 102 slid (e.g., they have complementary shapes and there is no gap between them) and so that fault blocks 104 and 106 may move or slide without obstruction, e.g., in the direction of throw vectors 108, e.g., tangent to fault surface 102. If fault blocks 104 and 106 model substantially rigid structures that remain in contact through the formation of fault surface 102, then there may be no protrusions (e.g., bumps or obstructions) in the direction of throw vectors 108. A protrusion may include a local change in the surface topography of fault surface 102, e.g., a local maximum or minimum or a rise and fall of crests and troughs of the surface topography. If there were substantial protrusions in the direction of throw vectors 108, these protrusions would have prevented fault block 104 on one side of fault surface 102 from moving relative to fault block 106 on the other side of fault surface 102. For example, the geometry of fault surface 102 may not be "egg-crate" shaped. Since the rise and fall of the crests and troughs of the "egg-crate" shape are in line with the direction in which these fault blocks did slide, these ridges would have prevented fault blocks 104 and 106 from sliding in the direction of the tangent of fault surface 102 as they did. Accordingly, such protrusions are erroneous data. Although fault surface 102 should not have bumps or protrusions in the direction in which fault blocks 104 and 106 slide, bumps or protrusions in other directions of fault surface 102 may be acceptable. For example, the geometry of fault surface 102 may be planar or shaped as a "ruled" surface (e.g., as is shown in FIG. 1B), e.g., with bumps or ridges in a direction normal to throw vectors 108. That is, acceptable bumps may have a rise and fall of the crests and troughs in a direction perpendicular to the direction in which fault blocks 104 and 106 slide. Since these bumps are not in the direction in which fault blocks 104 and 106 slide, these bumps allow proper sliding to accurately model fault surface 102.

Embodiments of the invention provide a modeling mechanism for generating a fault surface such as fault surface 102 with protrusions or ridges only in a direction in which the fault blocks do not slide (e.g., realistic surface variations) and not in the direction in which fault blocks do slide (e.g., unrealistic surface variations). In one embodiment of the invention, as scalar function f(x,y,z) which is part of the representation of fault surface 102 is constant at the location of fault 102, its gradient Gf(x,y,z) 110 is orthogonal to the surface of fault surface 102. Since gradient field 110 is orthogonal to fault surface 102, gradient field 110 of an impermissible protrusion is not orthogonal to the direction of the throw vectors 108 (e.g., as described in reference to FIG. 1C). Accordingly, embodiments of the invention may model scalar field f(x,y,z) (e.g., representing fault surface 102) such that gradient field 110 thereof is substantially orthogonal to the direction of the throw vectors 108. That is, fault surface 102 may not have protrusions in the direction in which blocks 104 and 106 slide relative to each other, but may have protrusions in a direction orthogonal thereto. That is, the change in the topography of the surface of fault surface 102, e.g., the rise and fall of bumps or protrusions, may be in a direction perpendicular to the direction in which the fault blocks 104 and 106 slide, i.e., in a direction that will not obstruct the movement of fault blocks 104 and 106.

Reference is made to FIG. 1C, which schematically illustrates a cross-section approximately orthogonal to geological horizons of an impermissible fault surface 112 having a protrusion 114. As described in reference to FIGS. 1A and 1B, the gradient field 110 of the scalar function f(x,y,z) which is part of the representation of fault surface 112 may be normal to fault surface 112. Also, as described in reference to FIGS. 1A and 1B, the direction of throw vectors 108 may be tangent to fault surface 112. When fault surface 112 has a protrusion 114, throw vectors 116 may not be orthogonal to gradient field 110 and as a consequence fault surface 112 may not be tangent to throw vectors 116. Accordingly, generating a scalar function f(x,y,z) whose gradient is substantially orthogonal to the throw vector field (e.g., as in FIGS. 1A and 1B), will prevent a fault surface represented as a level set of this function f(x,y,z) from having the impermissible protrusion 114 shown in FIG. 1C.

Faults may appear "blurred" in seismic images. The exact location of faults may be uncertain and thus, it may be difficult to position faults at an exact location on a 3D geological model. As a consequence, the location of the set of sampling points $F_{SP}$ coinciding with the fault may also be uncertain. Therefore, defining the geometry or shape of fault surface 102 (e.g., as planar, ruled, etc.) may provide additional information about the geometry of the fault to compensate for the intrinsic uncertainty in the sampling-points locations to position fault surface 102 within the modeled subsurface region 100 with greater accuracy.

Modeling a Throw Vector Field T(x,y,z) for a Fault F

Embodiments of the invention provide a system and method for generating a throw vector field 108, e.g., a tangent vector field, to fault surface 102. In one embodiment of the invention, an initial version f*(x,y,z) of the function f(x,y,z) defining a fault F* may be used to generate throw vector field 108 T(x,y,z) tangent to fault surface F* 102. This vector field 108 may be used in an iterative process to improve function f(x,y,z) modeling fault surface F. The iterative process may include executing, for a first time, the operations described in the section entitled "Modeling a Function f(x,y,z) For a Single Fault F," e.g., once without step (10), to automatically generate the initial function f*(x,y,z). Then the operations described in this section may be executed to automatically generate throw vector field 108. Finally, the operations described in the section entitled "Modeling a Function f(x,y,z) For a Single Fault F," may be executed for a second time, this time with step (10) using the automatically generated throw vector field 108 to automatically generate an improved second version f(x,y,z) of fault surface 102, e.g., modeling the accurate sliding of fault blocks on either side thereof.

N* may be the average normal to the level surface $FS_0$*, which includes points (x,y,z) of the model at which the function f*(x,y,z) is equal to $f_0$. If the actual direction of throw vector field 108 is unknown, the average direction of the throw vector field T(x,y,z) of the fault surface F* may be set to the vertical (z) direction of the model. Accordingly, in one embodiment of the invention, throw vector field T(x,y,z)

108 may be approximated to be a constant unit vector T defined, for example, as follows:

$$T(x, y, z) = T = \frac{N^* \times V \times N^*}{\|N^* \times V \times N^*\|} \quad (6)$$

where the symbol "×" represents the cross product operator and where V represents a unit vector in the vertical (z) direction of the model.

Throw vector field $T(x,y,z)$ 108 may be approximately constant and equal to vector T, e.g., as defined in equation (6). Accordingly, fault surface 102 may be generated to model geological structures which were formed by continuously sliding against each other, for example, according to step (10) in the section entitled "Modeling a Function $f(x,y,z)$ For a Single Fault F" and as shown in FIG. 1B.

The initial version $f^*(x,y,z)$ of the function $f(x,y,z)$ associated to fault F may be generated, e.g., as described in the section entitled "Modeling a Function $f(x,y,z)$ For a Single Fault F." In one embodiment of the invention, throw vector field $T(x,y,z)$ 108 may be generated, for example, using the following steps (other operations or series of operations may be used, and the exact set of steps shown below may be varied):

1) Initialize a vector G, e.g., to be the null vector (0,0,0).
2) Select a set of sampling points $N_{SP} = \{n_1, n_2, \ldots\}$ located on a surface patch FS. For example, $N_{SP}$ may be identical to the set of sampling-points $F_{SP}$ of a fault F.
3) for each sampling point (n) of $N_{SP}$:
   a. compute the gradient $G(x_n, y_n, z_n)$ of $f^*(x,y,z)$ at location $(x_n, y_n, z_n)$; and
   b. add $G(x_n, y_n, z_n)$ to G by vector addition.
4) Compute the average normal $N^*$ to be $$\frac{G}{\|G\|},$$

where $\|G\|$ is the norm of G.
5) Compute the throw vector field $T(x,y,z)$ 108 to be the unit vector T, e.g., as defined by equation (6).
6) Optionally return to step (3) using an improved function $f(x,y,z)$ in place of initial function $f^*(x,y,z)$. The improved function $f(x,y,z)$ may be generated by executing the operations described in the section entitled "Modeling a Function $f(x,y,z)$ For a Single Fault F," using in operation (10) of the cited section, throw vector field 108 generated in step (5) of this section.
7) Stop Embodiments of this process may use an initial version $f^*(x,y,z)$ of the function $f(x,y,z)$ associated with a fault F to evaluate the average normal of sampling points. Alternatively, the principal directions associated with sampling points may be used, e.g., as described herein.

In another embodiment of the invention, throw vector field $T(x,y,z)$ 108 may be generated without using the initial version $f^*(x,y,z)$ of the function $f(x,y,z)$, for example, according to the following operations (other operations or series of operations may be used, and the exact set of steps shown below may be varied):

1) Generate a matrix [Q] initialized to be, for example, a 3×3 null matrix.
2) For each sampling-point (p) in the set $F_{SP}$ (e.g., represented by coordinates $(x_p, y_p, z_p)$), add a matrix $[Q(p)]$ to [Q], where matrix $[Q(p)]$ is, for example, a 3×3 matrix defined as follows:

$$[Q(p)] = \begin{bmatrix} x_p \\ y_p \\ z_p \end{bmatrix} \bullet \lfloor x_p \ y_p \ z_p \rfloor$$

where the symbol "·" represents the dot product operator of matrices.
3) Compute the unit Eigen vectors $\{E_1, E_2, E_3\}$ and corresponding Eigen values $\{e_1, e_2, e_3\}$ of the matrix [Q] generated in step (6). Order the Eigen values so that $e_1 \geq e_2$ and $e_2 \geq e_3$.
4) Set the average normal of the set of sampling-points $F_{SP}$ to be the Eigen vector $E_3$, which corresponds to the smallest Eigen value $e_3$.
5) Compute vector T as defined by equation (6).
6) Stop Throw vector field $T(x,y,z)$ 108 generated in this section may for example be used in step (10) of the section entitled "Modeling a Function $f(x,y,z)$ For a Single Fault F" to generate fault surface 102 in which the geological behavior and geometric properties of the fault are taken into account.

Modeling a Throw Vector Field $T(x,y,z)$ for a Fault F with a General Geometry

There are various types of faults, for example, planar faults, ruled or ridged faults, listric faults, and faults having a more complex surface topography. Planar faults (e.g., shown in FIG. 1B) form over time when a fault block on one side of a fault surface has moved in a constant direction relative to a fault block on the other side of the fault surface. Accordingly, the throw vector field $T(x,y,z)$ of fault surface 102 is constant in the direction of fault motion. In contrast, listric faults or curved normal faults (e.g., shown in FIG. 1A) form when fault block 104 on one side of fault surface 102 rotates or moves in a non-constant direction relative to fault block 106 on the other side of fault surface 102. Accordingly, the throw vector field $T(x,y,z)$ is not constant in the direction of fault motion.

The section entitled "Modeling a Throw Vector Field $T(x,y,z)$ For a Fault F" describes how to generate a throw vector field $T(x,y,z)$ 108 that is constant. A constant throw direction $T(x,y,z)$ may be used to model faults in which fault blocks 104 and 106 slide in a constant direction relative to each other, e.g., planar faults or ruled faults, but typically not faults in which fault blocks 104 and 106 slide in a non-constant direction relative to each other, e.g., listric faults. Accordingly, an alternative process may be used to generate throw vector field $T(x,y,z)$ 108 to model faults of a subsurface fractured in a non-constant direction, e.g., listric faults.

The following process may generate throw vector field $T(x,y,z)$ 108 for modeling fault surfaces 102 having a general geometry. To model a general geometry of fault surfaces 102, rigid body mechanics may be used, in which the field of cinematic velocity $T(q)$ of a particle of any solid satisfies the following well known "Varignon" equation:

$$T(x,y,z) = T(q) = T_0 + (q - q_0) \times R \quad (7)$$

where the symbol "×" represents the cross product operator, and for example:
   $q_0$ may be an arbitrary point on fault surface 102. For example, $q_0$ may be one of the sampling-points of $F_{SP}$ located near the center of fault surface 102.
   q may be an arbitrary point in a 3D space used for modeling.

$T_0$ may be a constant vector equal to T(x,y,z) at a point $q_0$. By analogy with equation (6), $T_0$ may be, for example:

$$T_0 = \frac{G_0 \times V \times G_0}{\|G_0 \times V \times G_0\|} \quad (8)$$

where the symbol "×" represents the cross product operator, V represents a unit vector in the vertical (z) direction of the model and $G_0$ may be the gradient of f*(x,y,z) at point $q_0$ on the modeled fault surface F.

R may be a constant vector equal to the rotational or curl of the vector field T(x,y,z). For example, R may be defined to satisfy the following equation for a given set of points (q) chosen on the fault F, e.g., in a least squares sense:

$$\{(q-q_0) \times Gf^*(q)\} \cdot R = T_0 \cdot Gf^*(q) \quad (9)$$

where the symbols "×" and "·" represent the cross product and the dot product operators, respectively, and where Gf*(q) represents the value of the gradient of the function f*(x,y,z) at point (q) on the modeled fault surface F.

The initial version f*(x,y,z) of the function f(x,y,z) associated to fault F may be generated, e.g., as described in the section entitled "Modeling a Function f(x,y,z) For a Single Fault F." In one embodiment of the invention, throw vector field T(x,y,z) 108 may be generated, for example, using the following steps (other operations or series of operations may be used, and the exact set of steps shown below may be varied):

1) Select an arbitrary point $q_0$ on a fault surface F 102. For example, select a sampling point in the set $F_{SP}$ that is closest to the center of gravity of points in the set $F_{SP}$.
2) Compute $T_0$, e.g., according to equation (8).
3) Compute R, e.g., according to equation (9).
4) Set the throw vector field T(x,y,z) to be the vector field defined by equation (7).
5) Stop.

Throw vector field T(x,y,z) 108 generated in this section may be used for example in step (10) of the section entitled "Modeling a Function f(x,y,z) For a Single Fault F" to generate fault surface 102 in which the geological behavior and geometric properties of the fault are taken into account.

Modeling a Surface Patch FS for a Fault F

Embodiments of the present invention include generating a function f(x,y,z) in which a level set $FS_0$ for a value $f_0$ is a surface containing a modeled fault F. The function f(x,y,z) may be computed on the nodes of a 3D mesh M according to embodiments described herein or another known method. To visualize the modeled fault F, a surface patch that approximates the fault F may be generated, for example, according to the following operations (other operations or series of operations may be used, and the exact set of steps shown below may be varied):

1) Generate a volume FV including the sampling-points in the set $F_{SP}$ modeling fault F. For example, FV may be a set of tetrahedral cells generated using the Delaunay algorithm (e.g., in tetrahedral models, vertices may be the sampling points in the set $F_{SP}$).
2) Optionally, volume FV may be:
   enlarged to increase the size of fault F beyond the range of the sampling-points in the set $F_{SP}$;
   shrunk to reduce the size of fault F; and/or
   edited to change the shape of the border of fault F.
3) Compute a surface corresponding to the boundary $FV_B$ of FV.
4) Generate a surface $FS_0$ composed of a set of polygons. In one embodiment, $FS_0$ may include a set of triangles, for example, generated using a classical "marching" algorithm.
5) Cut $FS_0$ by the surface $FV_B$ and re-generate the surface $FS_0$ using polygons so that the edges of the faces of the new polygons do not cross the surface $FV_B$.
6) Define the surface patch FS to be the surface is composed of polygons in the set $SF_0$ and contained within FV after the cutting operation.
7) Stop.

Editing the Boundary of a Surface Patch FS for a Fault F

The volume FV used to generate the surface patch FS may be generated automatically according to the aforementioned process and, as a consequence, the boundary of the surface patch SF may also be generated automatically. However, when the boundary of the surface patch SF contradicts known information associated with the fault surface F, e.g., which may be automatically generated or known by a geologist, an interactive editing process may be used, for example, according to the following process (other operations or series of operations may be used, and the exact set of steps shown below may be varied):

1) Using any appropriate graphing device (e.g., computer system 130 as described in FIG. 7), generate a (e.g., 2D or 3D) display with an appropriate visualization technique to view the surface patch FS and its boundary $FS_B$. The surface patch FS may be composed of closed polygonal curves, e.g., triangles.
2) Using any appropriate input device (e.g., input device 165 as described in FIG. 7, such as, a mouse) receive an indication to move nodes or vertices of the boundary $FS_B$ selected by the input device.
3) Modify the geometry of the boundary $FS_B$ while ensuring that the selected nodes or vertices remain on the level set $FS_0$.
4) Re-generate the surface patch FS to be the intersection of $FS_0$ and the new boundary $FS_B$ modified in step (3).

Although step (2) describes nodes or vertices of the boundary $FS_B$ being selected or moved via an input device, e.g., it may be appreciated by a person of skill in the art that the nodes or vertices of the boundary $FS_B$ may be selected or moved automatically. For example, in an embodiment of the invention, a computing module (e.g., in computing system 130 as described in FIG. 7) may have a database or entry field including predetermined criteria, which when the boundary $FS_B$ is in violation thereof, the erroneous nodes are automatically identified and the boundary $FS_B$ is automatically moved.

Modeling a Family of Sub-Parallel Faults

In parts of the Earth where tectonic activity affects a wide region of the subsurface, many faults may be formed by the same subsurface deformations and accordingly, may be substantially parallel to each other. These faults may be referred to as "sub-parallel" faults.

Figure 3A:
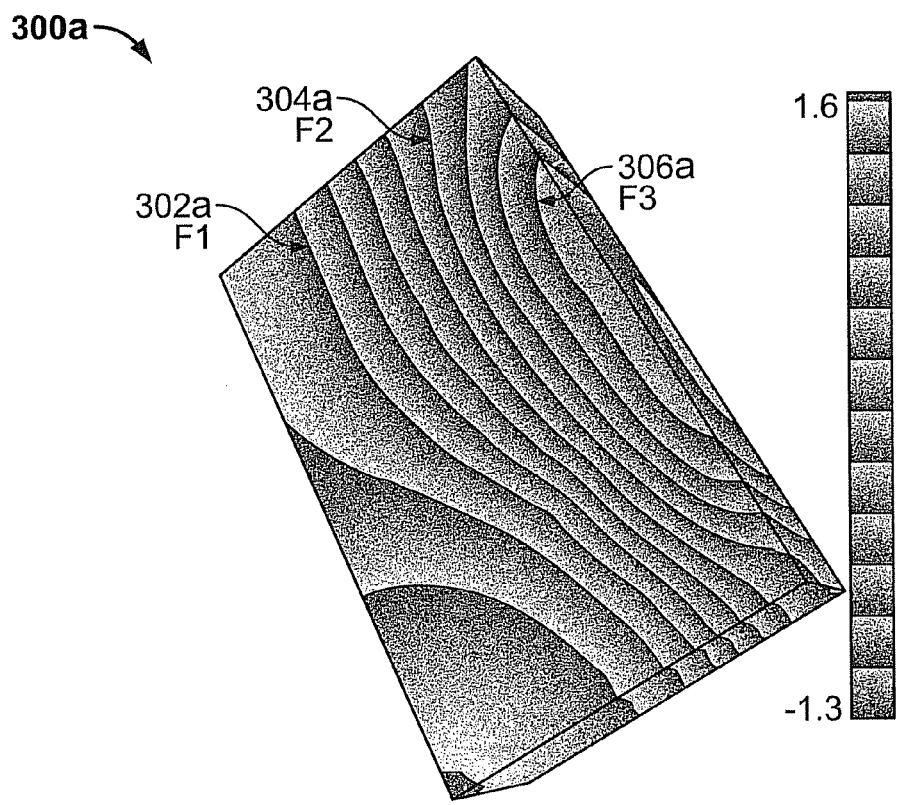
FIGS. 3A and 3B are schematic illustrations of a plurality of sub-parallel faults and a set of sampling points from which the faults are generated (e.g., from which data representing modeled faults is created), respectively, according to an embodiment of the invention.
Figure 3B:
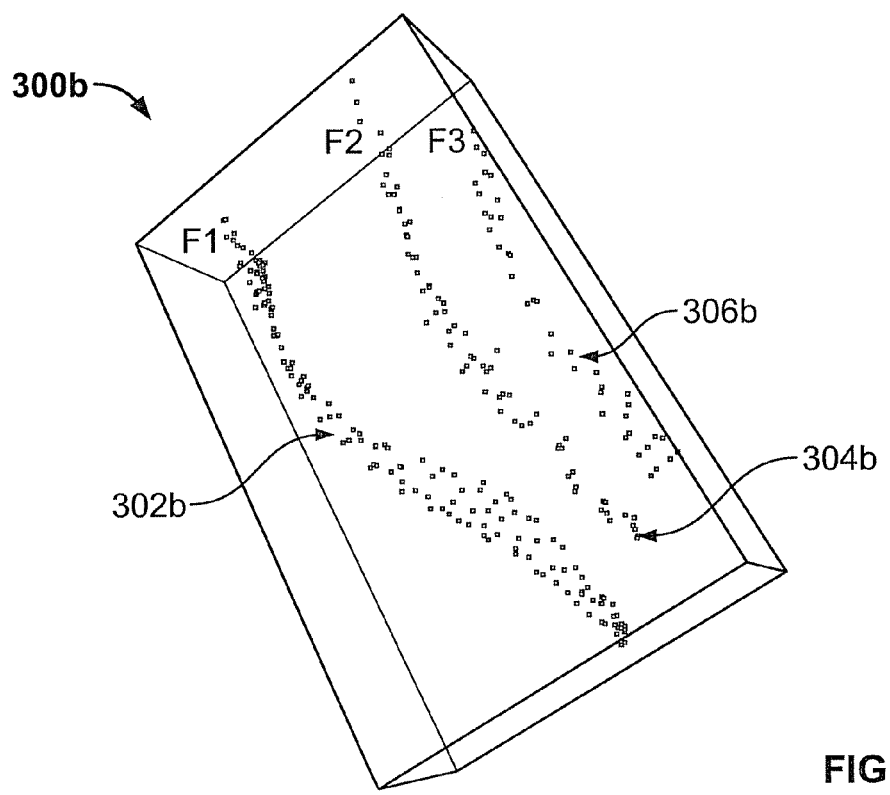

Reference is made to FIGS. 3A and 3B, which schematically illustrate a model 300a of a plurality of sub-parallel faults 302a, 304a, and 306a, and a model 300b of a plurality of corresponding sets of sampling points 302b, 304b, and 306b, respectively, according to embodiments of the invention. Each of the plurality of sub-parallel faults 302a, 304a, and 306a, is generated by approximating a surface that includes the corresponding set of sampling points 302b, 304b, and 306b, respectively.

If plurality of faults 302a, 304a, and 306a do not intersect each other in the domain of model 300a (e.g., by crossing or branching from each other), faults 302a, 304a and 306a may be modeled together, e.g., using a single scalar field of a function f(x,y,z) and a series of level set values. When two faults cross or intersect at a point, the point of intersection is typically associated with both of the intersecting faults. Since a scalar field f(x,y,z) has a single scalar value for each point in the 3D modeled domain, each scalar value $fi_0$ may be associated with a single fault $F_i$. Accordingly, the faults do not cross. Embodiments of the invention may be used to ensure that parallel fault surfaces do not cross when they are modeled. Furthermore, generating several models of faults using a single scalar field may reduce memory usage and processing time as compared to generating each of the faults individually using a scalar field.

The aforementioned notations typically associated with a single fault may be modified in this section to accommodate a description of a plurality of sub-parallel faults, for example, as follows:

For each of the plurality if faults $F_i$ where $1 \le i \le N$:
  Fault patch FS may be denoted by $F_iS$;
  Fault level set $FS_0$ may be denoted by $F_iS_0$;
  Level set value $f_0$ may be denoted by $fi_0$; and
  Fault sampling points $F_{SP}$ may be denoted by $F_iSP$.

A plurality of sub-parallel faults $\{F_1, \ldots, F_n\}$ defined by the set of sampling points $\{F_1SP, \ldots, F_nSP\}$, respectively, may be modeled in a 3D modeling domain, for example, using the following operations (other operations or series of operations may be used, and the exact set of steps shown below may be varied):

1) Cover a 3D geological domain by a mesh M. Mesh M may be composed of cells, faces, edges, and vertices (e.g., nodes) arranged for example as a regular or irregular array, lattice or grid. In a preferred embodiment, the cells may be shaped as tetrahedron or hexahedron cells, although other shapes may be used.
2) A scalar field function f(x,y,z) may be defined by its values sampled at the nodes of mesh M. For any point (x,y,z) of the model, which is not a node of M, the value of the scalar field f(x,y,z) at the point (x,y,z) may be generated, e.g., locally approximated, from the value of f(x,y,z) at neighboring nodes. For example, the value of f(x,y,z) at the point (x,y,z) may be locally approximated by a linear approximation.
3) Select a fault $F_p$ in $\{F_1, \ldots, F_n\}$ and select a value $fp_0$ for the function f(x,y,z) on $F_pS_0$. The value $fp_0$ may be any arbitrary real number. For example, $fp_0$ may be zero. $F_p$ may be the fault in $\{F_1, \ldots, F_n\}$ that is associated with the greatest number of sampling points $F_pSP$ of all the sets of sampling points $\{F_1SP, \ldots, F_nSP\}$. Alternatively, $F_p$ may be randomly selected or selected based on another predetermined criterion.
4) For each sampling-point (p) in the set $F_pSP$ (e.g., represented by coordinates $(x_p, y_p, z_p)$), set the value of the function $f(x_p, y_p, z_p)$ at the sampling-point (p) equal to $fp_0$. For example, if the DSI method is used to approximate f(x,y,z) at the nodes of mesh M, then a DSI-Control-Point constraint may be installed specifying that the function $f(x_p, y_p, z_p)$ at the sampling-points is equal to $fp_0$.
5) For each fault $F_i$ in $\{F_1, \ldots, F_n\}$, including the fault $F_p$, use the average normal:
  a. Generate a matrix [Q] initialized to be, for example, a 3×3 null matrix.
  b. For each sampling-point (p) in the set $F_iSP$ (e.g., represented by coordinates $(x_p, y_p, z_p)$), add a matrix [Q(p)] to [Q], where matrix [Q(p)] is, for example, a 3×3 matrix defined as follows:

$$[Q(p)] = \begin{bmatrix} x_p \\ y_p \\ z_p \end{bmatrix} \bullet \lfloor x_p \; y_p \; z_p \rfloor$$

where the symbol "·" represents the dot product operator.
  c. Compute the unit Eigen vectors $\{E_1, E_2, E_3\}$ and corresponding Eigen values $\{e_1, e_2, e_3\}$ of the matrix [Q] generated in step (ii). Order the Eigen values so that $e_1 \ge e_2$ and $e_2 \ge e_3$.
  d. Set the average normal of the set of sampling-points $F_iSP$ to be the Eigen vector $E_3$, which corresponds to the smallest Eigen value $e_3$.
  e. Set the average gradient of the function $f(x_p, y_p, z_p)$ computed at sampling points $(x_p, y_p, z_p)$ in $F_iSP$ equal to $E_3$. For example, if the DSI method is used to approximate f(x,y,z) at the nodes of mesh M, then a DSI-Average-Gradient constraint may be installed specifying that the average of the gradient of the function $f(x_p, y_p, z_p)$ is equal to $E_3$.
6) For each fault $F_i$ in $\{F_1, \ldots, F_n\}$ other than $F_p$, use one of the following options:
  a. Option 1:
    i. Arrange the sampling-points $p_i$ in the set $F_iSP$ in an ordered sequence so that each sampling-point is listed once.
    ii. Pair each sampling-point $p_a$ in the sequence with the subsequent point $p_b$ in the sequence. The last point in the sequence may be paired with the first point in the sequence.
    iii. For each pair $(p_a, p_b)$ of sampling points (e.g., represented by coordinates $(xp_a, yp_a, zp_a)$ and $(xp_b, yp_b, zp_b)$), set the difference between the value of the scalar field function f(x,y,z) at point $(xp_a, yp_a, zp_a)$ and point $(xp_b, yp_b, zp_b)$ to zero (i.e., the value of the function is equal for both points):

$$f(xp_a, yp_a, zp_a) - f(xp_b, yp_b, zp_b) = 0.$$

For example, if the DSI method is used to approximate f(x,y,z) at the nodes of mesh M, then a DSI-Delta constraint may be installed specifying that the difference between the value of the function f(x,y,z) at the points $(p_a)$ and $(p_b)$ is zero.
  b. Option 2:
    i. Choose one reference point $(p_a)$ in the set $F_iSP$ (e.g., represented by coordinates $(xp_a, yp_a, zp_a)$);
    ii. For each sampling point $(p_b)$ in $F_iSP$ (e.g., represented by coordinates $(xp_b, yp_b, zp_b)$), set the difference between the value of the scalar field function f(x,y,z) at point $(xp_a, yp_a, zp_a)$ and point $(xp_b, yp_b, zp_b)$ to zero (i.e., the value of the function is equal for both points in each pair of points):

$$f(xp_a, yp_a, zp_a) - f(xp_b, yp_b, zp_b) = 0.$$

For example, if the DSI method is used to approximate f(x,y,z) at the nodes of mesh M, then a DSI-Delta constraint may be installed specifying that the difference between the value of the function f(x,y,z) at the points $(p_a)$ and $(p_b)$ is zero.

7) For each fault $F_i$ in $\{F_1, \ldots, F_n\}$, including the fault $F_p$:
   a. For each sampling-point (p) in the set $F_iSP$, set the gradient $Gf(x_p, y_p, z_p)$ of the function $f(x,y,z)$ at the sampling point $(x_p, y_p, z_p)$ to be orthogonal to a vector field $T(x,y,z)$ of throw vectors. For example, if the DSI method is used to approximate $f(x,y,z)$ at the nodes of mesh M, since the dot product of orthogonal vectors is zero, install a (e.g., "soft") constraint specifying that, the dot product of the gradient $Gf(x_p, y_p, z_p)$ and the vector field $T(x_p, y_p, z_p)$ is as close to zero as possible. Note that only the direction of the vector field $T(x_p, y_p, z_p)$ may be required in the computation of such a constraint. Note also that such a constraint allows the intrinsic geological behavior of a fault to be taken into account.
   b. If the set of sampling-points, $F_iSP$, includes geometrical information in addition to the modeled locations of the sampling-points (p), use this information as constraints on the function $f(x,y,z)$, for example, as follows.
      i. If the set of sampling-points, $F_iSP$, includes lines (e.g., a continuous or discrete set of points forming a line) then for each sampling point p where line information is available:
         1. Compute a vector $tg(p)$ that is a tangent vector to the line at node p; and
         2. Install a constraint on node p specifying that the gradient of the function $f(x,y,z)$ at node p is orthogonal to the vector $tg(p)$.
      ii. If $F_{SP}$ includes surface patches then for each sampling point p where surface information (e.g., a continuous or discrete set of points forming a surface) is available:
         1. Compute a vector $n(p)$ that is normal to the surface patch at node p; and
         2. Install a constraint on node p specifying that the gradient of the function $f(x,y,z)$ at node p is collinear to $n(p)$ or equal to $n(p)/\|n(p)\|$ if the function $f(x,y,z)$ is a signed distance map of the set $F_pSP$.
8) For each node p of mesh M, a smoothness constraint may be applied specifying that the function $f(x,y,z)$ varies smoothly in the 3D geological domain, e.g., while honoring the constraints in the steps above. As a non-limiting example, if the DSI method is used, a "smoothness constraint" may be used, defined in the neighborhood of each node (p) of the mesh M, for example, by one or more of the following:
   a. Smoothness constraint #1: In the neighborhood of (p), the gradient of the function $f(x,y,z)$ is constrained to be as constant as possible; and
   b. Smoothness constraint #2: In the neighborhood of (p), the function $f(x,y,z)$ is constrained to vary linearly, as much as possible.
   Using smoothness constraints #1 or #2, the function $f(x,y,z)$ may be a signed distance map to sampling points $F_pSP$ of fault $F_p$, for example, if the value $fp_0$ is zero.
9) Use the DSI method or another equivalent method to compute the values of the function $f(x,y,z)$ at the nodes of mesh M, e.g., while honoring all the constraints specified in the steps above.
10) Optionally, proceed to the processes described in the sections entitled "Modeling a Throw Vector Field $T(x,y,z)$ For a Fault F" and/or "Modeling a Surface Patch FS for a Fault F" for example to improve the accuracy with which the function $f(x,y,z)$ approximates a fault surface and to compute surface patches, respectively, for some or all of faults $F_i$ in $\{F_1, \ldots, F_n\}$.
11) Stop Embodiments of the invention may be used to automatically generate (e.g., model) a series of substantially parallel fault surfaces 102, which may come close to each other, but typically do not cross or intersect in the modeled domain. In one embodiment, if the plurality of faults are substantially parallel in only a first region of the modeled domain and cross or intersect in a second region of the modeled domain, then the faults may be modeled by this process in the first region and by another process in the second region. The fault models in the first and the second region may be merged at the boundary of the two regions, for example, by a known approximation mechanism. The different regions and/or the process by which the region is modeled may be automatically determined, e.g., according to default settings or based on optimization or error calculations, or alternatively, may be manually set by a user.

Generating a Consistent Fault Network

A geological modeled domain may be divided into a plurality of fault blocks "cut" by a set of faults FN called a fault network:

$$FN = \{F_1, F_2, \ldots\} \quad (10)$$

Once each of the individual faults in the set FN is modeled, some or all of the faults in the fault network may be modified, for example, to ensure that the relationship between each pair of faults $(F_a, F_b)$ in the set FN is consistent with the structural geology of the subsurface being modeled. Accordingly, the geometry and topological relationship between each pair of faults $F_a$ and $F_b$ may be analyzed and edited automatically by a computing system (e.g., computing system 130 of FIG. 7).

Notations typically associated with a single fault may be modified in this section to accommodate a description of a plurality of faults in a fault network, $FN = \{F_1, F_2, \ldots\}$, for example, as follows:

For each of the plurality of faults $F_i$ a fault network, where $1 \leq i \leq n$:
  function $f(x,y,z)$ may be denoted by $f_i(x,y,z)$;
  fault patch FS may be denoted by $F_iS$;
  fault level set $FS_0$ may be denoted by $F_iS_0$;
  level set value $f_0$ may be denoted by $fi_0$;
  fault sampling points $F_{SP}$ may be denoted by $F_iSP$;
  positive side region $FS_+$ may be denoted by $F_iS_+$; and
  negative side region FS– may be denoted by $F_iS$–.

In the sections that follow, a series of processes are proposed to automatically identify a type of relationship between faults $F_a$ and $F_b$ in the fault network and, optionally, to edit or modify these relationships.

Determining a Type of Relationship Between Faults $F_a$ and $F_b$

Figure 4A:
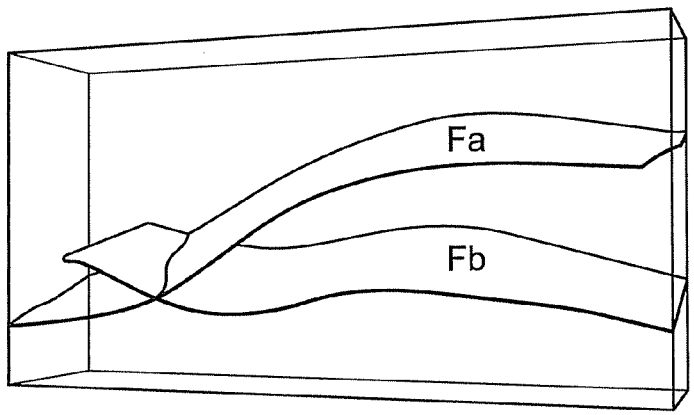
FIGS. 4A-4D are schematic illustrations of various types of relationships between faults according to an embodiment of the invention.
Figure 4B:
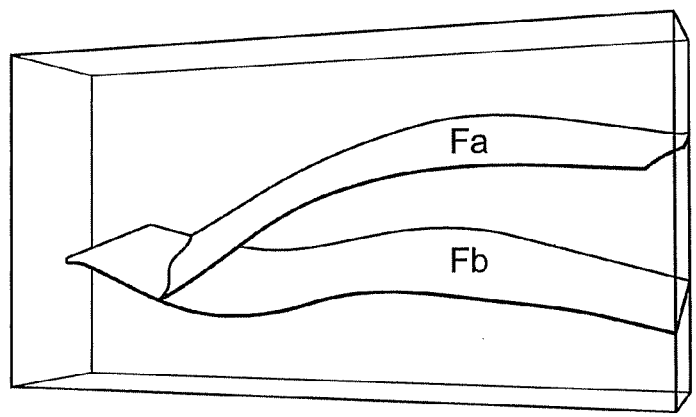
Figure 4C:
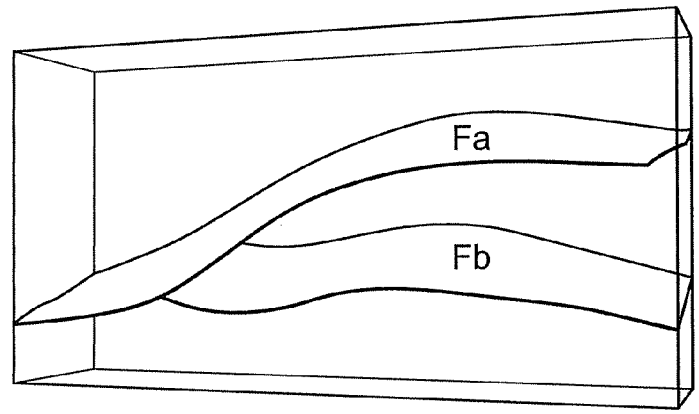
Figure 4D:
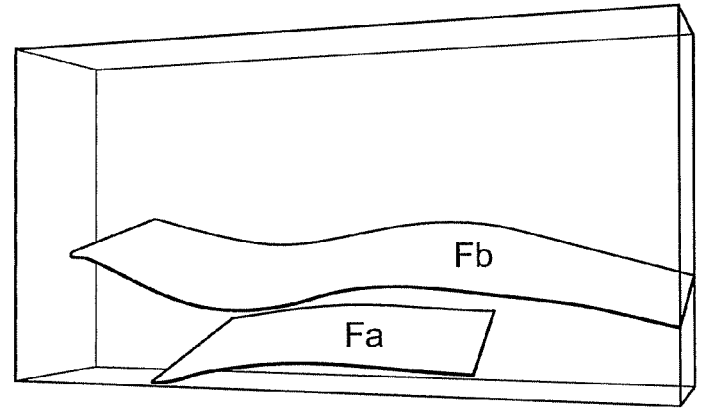

Reference is made to FIGS. 4A-4D, which schematically illustrate various types of relationships between faults according to an embodiment of the invention. Types of relationships between a pair of faults $F_a$ and $F_b$ in the fault network FN may include the types shown, for example, in:
  FIG. 4A, in which faults $F_a$ and $F_b$ cross each other at an intersection line. Typically, neither fault is considered to be a main fault or a secondary fault;
  FIG. 4B, in which faults $F_a$ and $F_b$ intersect, where $F_b$ is a "main" fault and $F_a$ is a "secondary" fault and the secondary fault $F_a$ branches from the main fault $F_b$;

FIG. 4C, in which faults $F_a$ and $F_b$ intersect, where fault $F_a$ is a "main" fault and the fault $F_b$ is a "secondary" fault and the secondary fault $F_b$ branches from the main fault $F_a$; and FIG. 4D, in which faults $F_a$ and $F_b$ do not intersect.

Embodiments of the invention automatically determine the type of relationship between faults $F_a$ and $F_b$ in a fault network FN, for example, using the following steps (other operations or series of operations may be used, and the exact set of steps shown below may be varied):

1) Identify the cells in a mesh M of a model that are intersected by each of the surface patches $F_aS$ and $F_bS$ of faults $F_a$ and $F_b$, respectively:
   a. If the cells intersected by the surface patch $F_aS$ are different than the cells intersected by the surface patch $F_bS$, it may be automatically determined that faults $F_a$ and $F_b$ do not intersect in the modeled domain. Faults $F_a$ and $F_b$ are the type shown in FIG. 4D. Stop.
   b. If at least one cell intersected by the surface patch $F_aS$ is also intersected by the surface patch $F_bS$, it may be automatically determined that faults $F_a$ and $F_b$ may intersect in the modeled domain. Proceed to step (2).
2) For each polygon $PF_{ai}$ of the surface patch $F_aS$ of the fault $F_a$:
   a. If at least one node or vertex of the polygon $PF_{ai}$ of the surface patch $F_aS$ of the fault $F_a$ is on the positive side region $F_bS_+$ of the fault $F_b$ and at least another node or vertex is on the negative side region $F_bS_-$ of the fault $F_b$, then it may be automatically determined that faults $F_a$ and $F_b$ intersect in the modeled domain. Proceed to step (3).
   b. If polygon $PF_{ai}$ is the last polygon in the surface patch $F_aS$, and all other polygons in $F_aS$ have been checked and no intersection has been found, it may be automatically determined that faults $F_a$ and $F_b$ do not intersect in the studied domain. Stop.
   c. If there is a subsequent polygon in the surface patch $F_aS$ that has not been checked repeat step (2) for the subsequent polygon.
3) Initialize counters $N_{a+}$, $N_{a-}$, $N_{b+}$ and $N_{b-}$, e.g., to zero. Counters $N_{a+}$ and $N_{a-}$ may be associated with the positive and negative side regions $F_aS_+$ and $F_aS_-$, respectively, of fault $F_a$ and counters $N_{b+}$ and $N_{b-}$ may be associated with the positive and negative side regions $F_bS_+$ and $F_bS_-$, respectively, of fault $F_b$.
4) For each sampling-point $p_a$ in the set $F_aSP$:
   a. If $p_a$ is located in the positive side region $F_bS_+$ then increment number $N_{a+}$, e.g., by the integer one (1).
   b. Otherwise, if $p_a$ is located in the negative side region $F_bS_-$ then increment number $N_{a-}$, e.g., by the integer one (1).
5) For each sampling-point $p_b$ in the set $F_bSP$:
   a. If $p_b$ is located in the positive side region $F_aS_+$ then increment number $N_{b+}$, e.g., by the integer one (1).
   b. Otherwise, if $p_b$ is located in the negative side region $F_aS_-$ then increment number $N_{b-}$, e.g., by the integer one (1).
6) Determine which fault is a main fault and which fault is a secondary fault, e.g., based on a predetermined criterion, such as, for example:
   a. if the counter $N_{a+}$ is substantially greater (e.g. 5 times greater) than other counter $N_{a-}$ and if other counters $N_{b+}$ and $N_{b-}$ are approximately the same (e.g., the same order of magnitude), then it may be automatically determined that fault $F_b$ is a main fault and fault $F_a$ is a secondary fault located on the positive side region $F_bS_+$ of the fault $F_b$ (faults $F_a$ and $F_b$ are the type shown in FIG. 4B);
   b. otherwise, if $N_{a-}$ is substantially greater (e.g. 5 times greater) than other counter $N_{a+}$ and if other counters $N_{b+}$ and $N_{b-}$ are approximately the same (e.g., the same order of magnitude), then it may be automatically determined that fault $F_b$ is a main fault and fault $F_a$ is a secondary fault located on the negative side region $F_bS_-$ of the fault $F_b$ (faults $F_a$ and $F_b$ are the type shown in FIG. 4B);
   c. otherwise, if $N_{b+}$ is substantially greater (e.g. 5 times greater) than other counter $N_{b-}$ and if other counters $N_{a+}$ and $N_{a-}$ are approximately the same (e.g., the same order of magnitude), then it may be automatically determined that fault $F_a$ is a main fault and fault $F_b$ is a secondary fault located on the positive side region $F_aS_+$ of the fault $F_a$ (faults $F_a$ and $F_b$ are the type shown in FIG. 4C);
   d. otherwise, if $N_{b-}$ is substantially greater (e.g. 5 times greater) than other counter $N_{b+}$ and if other counters $N_{a+}$ and $N_{a-}$ are approximately the same (e.g., the same order of magnitude), then it may be automatically determined that fault $F_a$ is a main fault and fault $F_b$ is a secondary fault located on the negative side region $F_aS_-$ of the fault $F_a$ (faults $F_a$ and $F_b$ are the type shown in FIG. 4C); and
   e. otherwise, there is no main and secondary fault (faults $F_a$ and $F_b$ are the type shown in FIG. 4A).
7) Stop Other criteria, definitions for types of faults, or steps for determining the number of sampling points in each of the positive and negative side regions of a fault may be used. For example, the number of sampling points in the positive and negative side regions may be determined, for example, by computing the range of the function $f_b(x,y,z)$ and $f_b(x,y,z)$ evaluated at the sampling points of the fault $F_a$ and $F_b$. If a type of fault is not determined by the aforementioned process, the fault may be assigned a default type, e.g., which may be stored (e.g., as data 155 in memory 150 of FIG. 7). For example, the default type of fault may be for faults $F_a$ and $F_b$ to cross each other and neither fault is considered to be a main fault or a secondary fault, e.g., as described in reference to FIG. 4A.

Improving the Geometry of Fault Branching

A model of a fault network may include a first fault, $F_a$, in a region of the subsurface. If tectonic stress changes in the region of the subsurface, a second fault, $F_b$, may develop having a different orientation. As the second fault $F_b$ propagates towards the first fault $F_a$, the tectonic stress forming the second fault $F_b$ may change in the neighborhood of the first fault, $F_a$, in which the subsurface is fractured in a different orientation. The angle between the faults $F_a$ and $F_b$ may be affected in a predictable manner, e.g., using solid body mechanics. According to embodiments of the invention, an angle between the faults $F_a$ and $F_b$ may be computed and applied to accurately orient the faults in a neighborhood at the places at which they intersect.

Figure 5B:
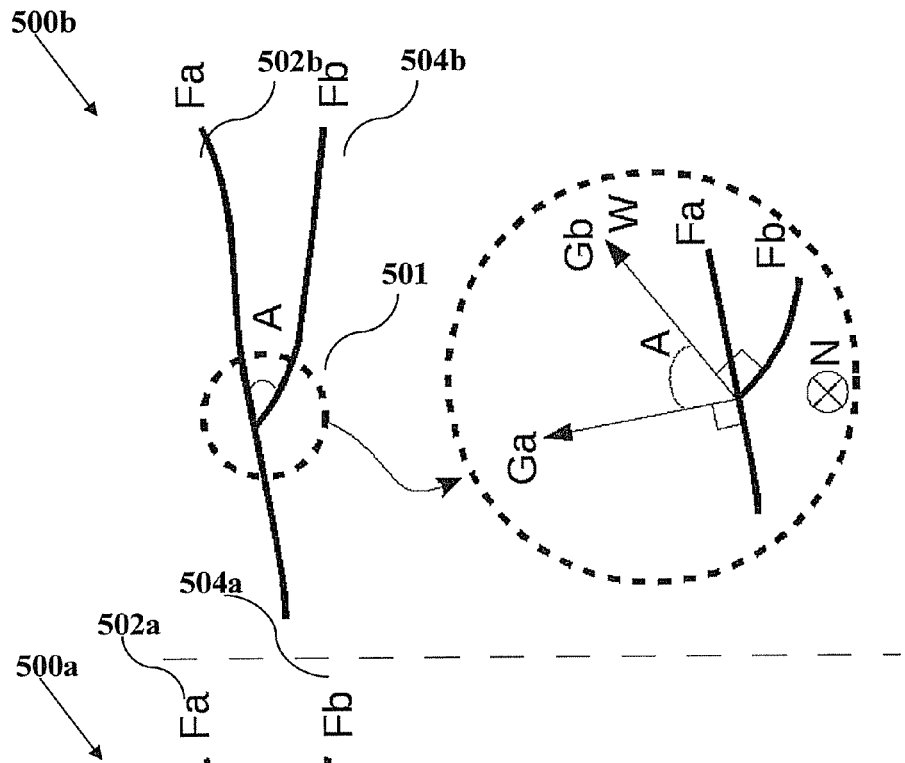
FIGS. 5A and 5B are schematic illustrations of cross-sectional views of an initial model of branching fault surfaces and an improved subsequent model of re-oriented branching fault surfaces according to embodiments of the invention.
Figure 5A:
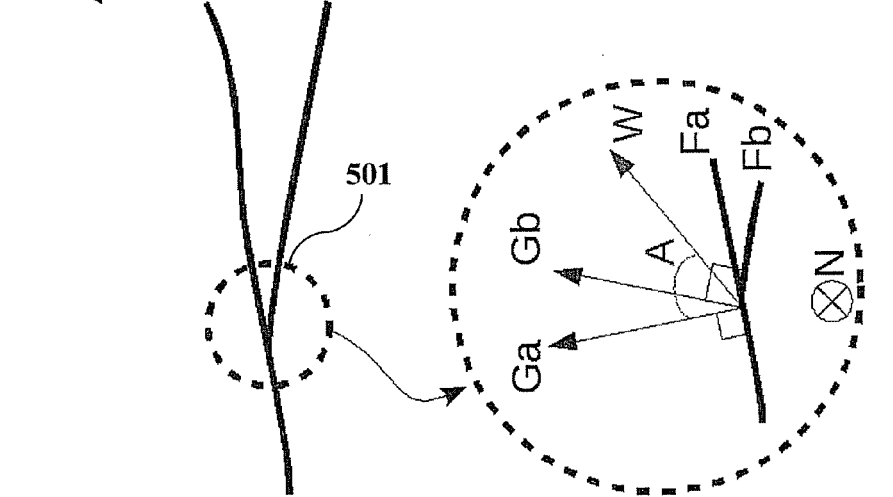

Once branching relationships between fault surfaces in a fault network are known, the information relating the relationships between fault surfaces may be integrated into the model of the fault surfaces, for example, using a level set approach described in the following steps (other operations or series of operations may be used, and the exact set of steps shown below may be varied):

1) Generate an initial model of branching fault surfaces $F_a$ and $F_b$ where secondary fault $F_b$ branches on main fault $F_a$.
2) Select or receive a value of a branching angle {A} between a fault surface $F_a$ and a fault surface $F_b$. For example, the branching angle {A} may be in the range of [0,π/2] radians, although other angles or ranges may be used.
3) Select or receive a distance value, d, measuring the distance from the intersection of the fault surfaces $F_a$ and $F_b$ for which the fault surfaces may retain the same branching angle {A}. This distance may approximate the distance for which the fault surfaces are linear or curve in a complementary manner so that they remain at an angle {A} relative to each other.
4) Compute the subset of nodes $D_{ab}$ of a mesh M of the model, where the nodes are within a distance d of both of the fault surfaces $F_a$ and $F_b$. For example, the subset of nodes of a mesh M for which the value of the scalar function $f_a(x,y,z)$ is within interval $[f_a 0-d_a, f_a 0+d_a]$ may be intersected with the subset of nodes of a mesh M for which the value of the scalar function $f_b(x,y,z)$ is within interval $[f_b 0-d_b, f_b 0+d_b]$. $d_a$ may be d multiplied by the norm of the average gradient $G_a$ of $f_a(x,y,z)$ on sampling points $F_a SP$ and $d_b$ may be d multiplied by the norm of the average gradient $G_b$ of $f_b(x,y,z)$ on sampling points $F_b SP$.
5) For each node (p) of the subset $D_{ab}$:
    a. Compute a normalized gradient vector of scalar function $f_a(x,y,z)$ for fault $F_a$ at location p:

$G_a(p)=Gf_a(x_p,y_p,z_p)/\|Gf_a(x_p,y_p,z_p)\|$.

b. Compute a normalized gradient vector of scalar function $f_b(x,y,z)$ for fault Fb at location p:

$G_b(p)=Gf_b(x_p,y_p,z_p)/\|Gf_b(x_p,y_p,z_p)\|$.

c. If the dot product $G_a(p) \cdot G_b(p)$ is negative, multiply either $G_a(p)$ or $G_b(p)$ by −1.
    d. Define a vector N(p) to be a vector cross product of Ga(p) and Gb(p):

$N(p)=Ga(p) \times Gb(p)$.

e. Compute a vector W(p) as the vector Ga(p) rotated about vector N(p) by angle {A} in the positive direction.
    f. Set the gradient $Gf_b(x_p,y_p,z_p)$ of $f_b(x,y,z)$ at point $(x_p,y_p,z_p)$ to be collinear to the vector W(p). For example, if the DSI method is used to approximate f(x,y,z) at the nodes of mesh M, then a DSI-gradient-direction constraint may be installed specifying that the gradient $Gf_b(x_p,y_p,z_p)$ of $f_b(x,y,z)$ at point $(x_p,y_p,z_p)$ is parallel to the vector W(p).
6) Generate a new model of branching fault surface $F_b$. In one embodiment the DSI method or another equivalent method may be used to compute new values of the function $f_b(x,y,z)$ of branching fault surface $F_b$, e.g., while honoring all the constraints used to generate the initial model of branching fault surface $F_b$ in step (1).
7) Optionally, the update of fault surface $F_b$ may be modified or edited according to either or both of the processes described in the sections entitled "Modeling a Surface Patch FS for a Fault F" and/or "Editing the Boundary of a Surface Patch FS for a Fault F."
8) Stop Reference is made to FIGS. 5A and 5B, which schematically illustrate cross-sectional views approximately parallel to horizons of an initial model 500a of branching fault surfaces $F_a$ and $F_b$ and an improved subsequent model 500b of re-oriented branching fault surfaces $F_a$ and $F_b$ according to embodiments of the invention. In FIGS. 5A and 5B, the fault $F_a$ is a "main" fault and the fault $F_b$ is a "secondary" fault and the secondary fault $F_b$ branches from the main fault $F_a$, although alternatively, $F_a$ may be the main fault and $F_b$ may be the secondary fault. The secondary fault $F_b$ and main fault $F_a$ may intersect along a point, line or curve, i.e., point(s).

In FIG. 5A an initial model 500a including branching fault surfaces $F_a$ 502a and $F_b$ 504a may be generated. According to embodiments of the invention, the intersection of the fault surfaces 502a and 504a may be regenerated, for example, if errors or sub-optimal data are detected automatically or by a user in a neighborhood 501 of the intersection. For example, new geometric parameters (such as angles, distances, curvatures, etc.) may be received by a computing module (e.g., in computing system 130 of FIG. 7) to generate subsequent model 500b of re-oriented branching fault surfaces $F_a$ 502b and $F_b$ 504b according to the new geometric parameters.

In one embodiment of the invention, a computing module may receive or compute a value of an angle at which branching fault surfaces may intersect. The computing module may receive or compute a value of a distance from the point(s) of intersection along which the angle between branching fault surfaces may be equal to the received value of the angle. The computing module may generate subsequent model 500b of re-oriented branching fault surfaces 502b and 504b intersecting at an angle equal to the received angle value for a distance equal to the received distance.

In one embodiment, initial model 500a may be modified near the intersection point(s) to generate subsequent model 500b. For example, branching fault surfaces 502b and 504b of subsequent model 500b may differ from branching fault surfaces 502a and 504a of initial model 500a within neighborhood 501. Alternatively, modifications applied to generate subsequent model 500b may extend beyond neighborhood 501. In one embodiment of the invention neighborhood 501 may be a circle (e.g., if the faults intersect at a point) or a cylinder (e.g., if the faults intersect along a line or curve) wherein the circular distance is substantially equal to the distance d from the point(s) of intersection. In another embodiment, the size or geometry of the neighborhood 501 may depend on the quality of the data being modeled, e.g., so that neighborhood 501 covers some or all uncertain or blurred regions near the intersection. For example, a computing module may automatically determine the size or geometry of the neighborhood 501, e.g., according to deviation or error calculations of the modeled data. In yet another embodiment, the size or geometry of the neighborhood 501 may be determined via an input signal received from an input device (e.g., input device 165 as described in FIG. 7, such as, a mouse), e.g., in which a user draws or selects neighborhood 501.

The value of an angle at which branching fault surfaces intersect and/or the value of the distance from the point of intersection along which there is a given angle between branching fault surfaces may be automatically determined, e.g., based on calculations of fault behavior using solid body mechanics, based on an optimization or error calculations, and/or based on the type of relationship between the intersecting faults. Alternatively, these may be manually selected by a user.

Automatic Restoration of Structural Coherency

For a pair of branching faults, one fault may be the main fault and the other fault may be the secondary fault. A branching fault is a fault which only extends on one side of a main fault. Accordingly, a fault representation of a branching fault using, e.g., polygons, may be cut at the intersection with the main fault and the part on the wrong side of the main fault may be discarded. Using scalar fields and level sets may render this operation straightforward as the position of any point (x,y,z) in the domain of interest relatively to each fault represented by a scalar field f and value $f_0$ is instantly known by simply testing the sign of the difference $f(x,y,z)-f_0$ at that location. Intersection computations may be done using these scalar fields instead of having to perform complex intersections of geometrical shapes in 3D. A model having an intersection that is uniquely defined may be generated, for example, by deleting repetitive data using the following operations (other operations or series of operations may be used, and the exact set of steps shown below may be varied):

1) For each pair of modeled fault surfaces $F_a$ and $F_b$:
   a. Determine a type of relationship associated with the pair of modeled fault surfaces $F_a$ and $F_b$, for example, as described in the section entitled "Determining a Type of Relationship Between Faults $F_a$ and $F_b$."
   b. if there is no intersection between modeled fault surfaces $F_a$ and $F_b$, return to step (1) for a subsequent pair of faults.
   c. if there is an intersection between modeled fault surfaces $F_a$ and $F_b$, e.g., in which both faults cross each other, no data is deleted from the model. Return to step (1) for a subsequent pair of faults.
   d. For a main fault $F_a$ and a secondary fault $F_b$, in which $F_b$ is on a first side $F_aS_+$ of the main fault $F_a$, for each polygon $PF_{bi}$ used to generate a surface patch $F_bS$ (an equivalent step may be used if if $F_b$ is a main fault or if $F_b$ is on the side $F_aS-$):
      i. if all vertices of the polygon $PF_{bi}$ are located on the first side $F_aS_+$ of the main fault $F_a$, proceed to a subsequent polygon $PF_{bi+1}$.
      ii. if all vertices of the polygon $PF_{bi}$ are located on a second side $F_aS-$ of the main fault $F_a$, remove the polygon $PF_{bi}$ from the surface patches of $F_bS$.
      iii. if at least one vertex of the polygon $PF_{bi}$ is located on the second side $F_aS-$ of the main fault $F_a$, and at least one vertex of polygon $PF_{bi}$ is located on the first side $F_aS_+$ of the main fault $F_a$, then cut or divide the polygon $PF_{bi}$ along a line along which $f_a(x,y,z)=fa_0$. This generates two sub-polygons $PF_{bi+}$ located on the first side $F_aS_+$ of the main fault $F_a$, and $PF_{bi-}$ located the second side $F_aS-$ of the main fault $F_a$. Remove the sub-polygon $PF_{bi-}$ from the surface patch $F_bS$.

2) Stop

When the geometry of branching faults is complex, a secondary fault $F_b$ which branches on a main fault $F_a$ may cross the level set of fault $F_a$ in more than one region of the model, e.g., once near the fault branching and also in other regions. If a branching fault $F_b$ crosses a level set of a main fault $F_a$ outside of surface patch $F_aS$, then the portion of the fault that crosses to the other side of $F_a$ may be deleted according to the aforementioned process. This may remove valuable fault data. To prevent the deletion of a portion of secondary fault $F_b$, e.g., $F_bS$, which crosses to an opposite side of fault $F_a$, the type of relationship between the faults $F_a$ and $F_b$ may be changed, e.g., from simple branching to partial branching. Accordingly, the secondary fault $F_b$ may only be restricted to one side of the main fault $F_a$ within the extension of the surface patch $F_aS$ and the data associated with the fault $F_b$ crossing the other side of fault $F_a$ may be preserved. In one embodiment, a computing system may implement restrictions which may be applied to the aforementioned restoration of structural coherency process to limit its effect on the given parts of the model.

Figure 6A:
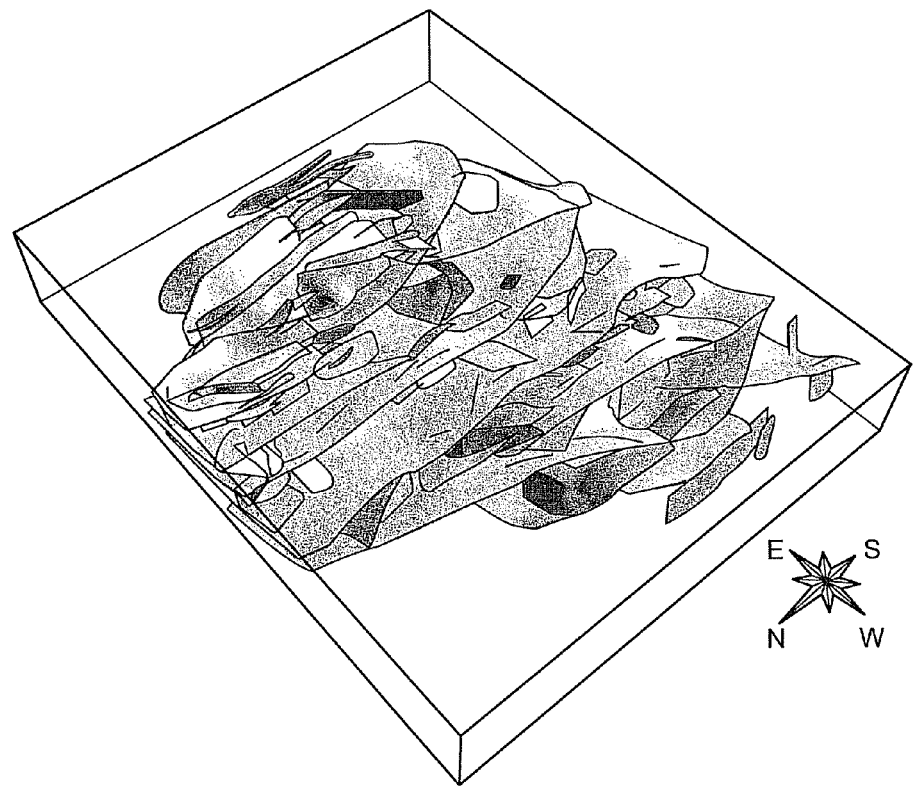
FIGS. 6A and 6B are schematic illustrations of a perspective view and top view, respectively, of a fault network modeled according to an embodiment of the invention.
Figure 6B:
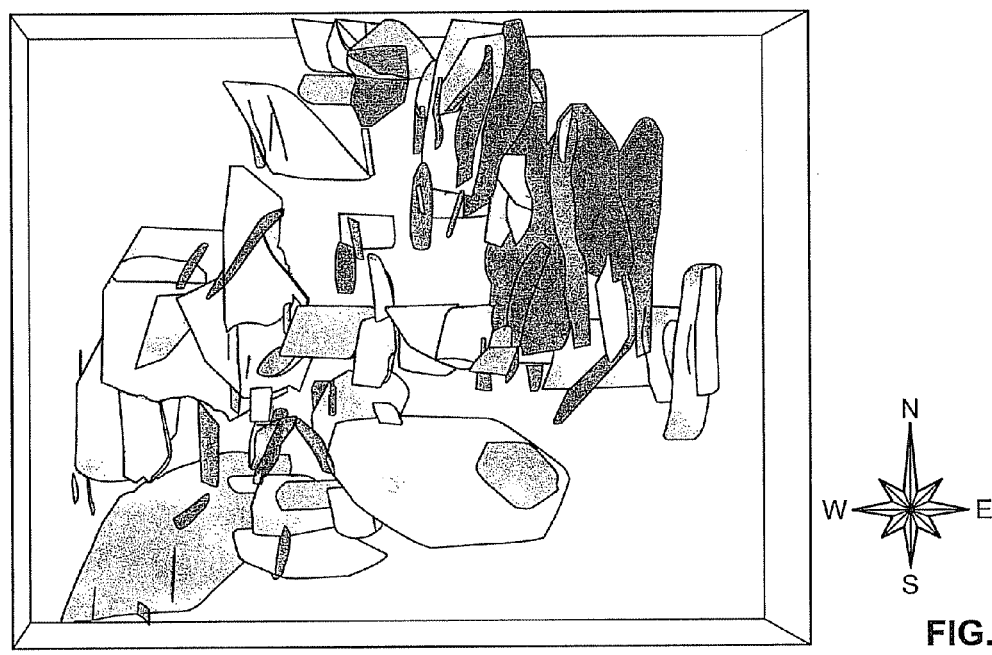

Reference is made to FIGS. 6A and 6B, which schematically illustrate a perspective and top view, respectively, of a fault network modeled according to embodiments of the invention. The fault network in FIGS. 6A and 6B includes 101 faults generated using seismic data actually collected from subsurface regions of the Earth.

Figure 6C:
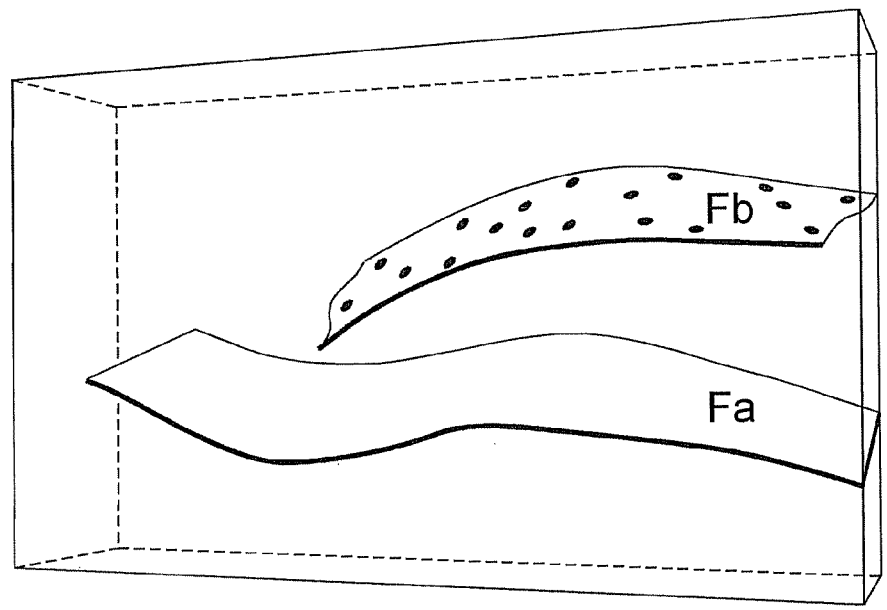
FIGS. 6C and 6D are schematic illustrations of branching faults having no intersection and which are extended to have an intersection, respectively, according to an embodiment of the invention.
Figure 6D:
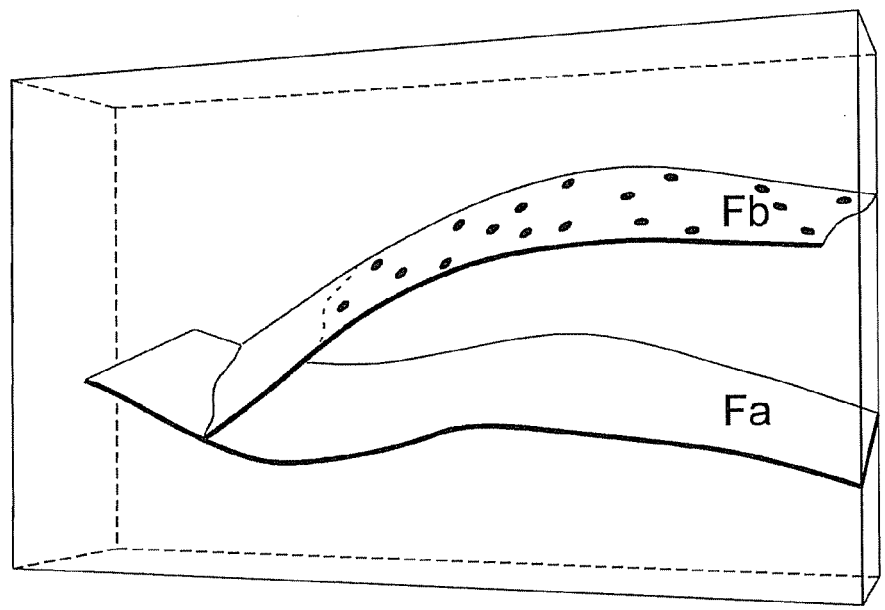

A boundary of faults having a branching relationship type, e.g., determined as described in section entitled "Determining a Type of Relationship Between Faults $F_a$ and $F_b$", may not have an actual intersection between surface patches. Whenever a branching relationship is detected, the boundary of the branching fault may be automatically edited as described in section entitled "Editing the Boundary of a Surface Patch FS for a Fault F" to enlarge the branching fault close to the main fault, e.g., in order to generate a geometrically coherent intersection. Reference is made to FIGS. 6C and 6D, which schematically illustrate branching faults having no intersection and which are extended to have an intersection, respectively, according to an embodiment of the invention. FIG. 6C schematically illustrates a branching fault $F_b$ and a main fault $F_a$. For example, due to the lack of data for $F_b$ close to $F_a$, fault $F_b$ does not extend all the way to $F_a$ and there is therefore no intersection between the faults, leaving a gap between the end of $F_b$ and main fault $F_a$. FIG. 6D schematically illustrates the faults $F_a$ and $F_b$, in which the boundary of fault $F_b$ is automatically extended towards fault $F_a$ in order to generate an actual contact between the faults. If an arrangement of two or more fault surfaces in a current model differs from a relationship type, e.g., determined as described in section entitled "Determining a Type of Relationship Between Faults $F_a$ and $F_b$", the intersection of the current model may be edited to generate a new arrangement of the faults having the determined relationship type. For example, one or more faults may be translated, rotated, and/or the angle between the faults may be corrected.

Translating One or More Faults in a Model

A fault may form in a region of the subsurface where terrains fracture in response to mechanical stress. As a consequence, a fault may be a volume of fractured rock rather than a surface or plane. In such cases, fault data may be imprecise, first because conventional data acquisition techniques are typically inexact and second because terrains may be fractured by such fault volumes but are conventionally modeled by a surface or plane. Additional data may be acquired or new interpretations may be made to provide new information associated with the location of the fault. In such cases, one or more faults may be translated from a first location to a second location according to the additional location data. In another embodiment of the invention, when additional data is not available and the location of faults is uncertain, one or more of the faults may be translated in a model. A new model may be generated and displayed to visualize each fault translation, thereby generating a plurality of distinct fault models, each model differing by the location of one or more faults. Such models may be inspected by a user to assess the impact of fault uncertainty and to select a preferred model.

When faults are modeled as level sets of a scalar field function f(x,y,z), one or more faults $F_i$ in a network of faults $\{F_1, \ldots, F_n\}$ may be translated in a model while keeping all faults coherent, e.g., maintaining the types of relationships that exist between faults that are not translated and computing new relationships between faults that are translated and other faults. The fault network $\{F_1, \ldots, F_n\}$ may be represented by scalar fields $\{f_1, \ldots, f_n\}$, level set values $\{f_01, \ldots, f_0n\}$ and a set of types of relationships associated with the faults, as described herein. Embodiments of the invention may translate one or more faults in the fault network, for example, using the following operations (other operations or series of operations may be used, and the exact set of steps shown below may be varied):

1) To translate a fault $F_i$ in $\{F1, \ldots, F_n\}$:
   a. Replace a current level set value $f_0i$ by a new level set value $f_0i'$ such that the level set $f_0i'$ represents fault $F_i$ at its translated location.
   b. Regenerate a surface patch $FS_i$ using the new level set value $f_0i'$, e.g., according to the process described in reference to the section entitled "Modeling a Surface Patch FS for a Fault F" or another process.
2) Using unaltered data associated with the types of relationships between faults, re-generate the fault network, e.g., according to the processes described in reference to the sections entitled "Determining a Type of Relationship Between Faults $F_a$ and $F_b$" and "Automatic Restoration of Structural Coherency" or other processes.
3) Stop.

It may be appreciated by persons of skill in the art that faults may be rotated, e.g., in addition or alternatively to translating fault.

Reference is made to FIG. 7, which schematically illustrates a system including a transmitter, receiver and computing system in accordance with an embodiment of the present invention. Methods disclosed herein may be performed using a system 105 of FIG. 7. In other embodiments, methods used herein may be performed by different systems, having different components.

System 105 may include a transmitter 190, a receiver 120, a computing system 130, and a display 180. The aforementioned data, e.g., seismic data and well markers used to form intermediate data and finally to model subsurface regions, may be ascertained by processing data generated by transmitter 190 and received by receiver 120. Intermediate data may be stored in memory 150 or other storage units. The processes described herein may be performed by software 160 being executed by processor 140 manipulating the data.

Transmitter 190 may transmit signals, for example, acoustic waves, compression waves or other energy rays or waves, that may travel through subsurface (e.g., below land or sea level) structures. The transmitted signals may become incident signals that are incident to subsurface structures. The incident signals may reflect at various transition zones or geological discontinuities throughout the subsurface structures. The reflected signals may include seismic data.

Receiver 120 may accept reflected signal(s) that correspond or relate to incident signals, sent by transmitter 190. Transmitter 190 may transmit output signals. The output of the seismic signals by transmitter 190 may be controlled by a computing system, e.g., computing system 130 or another computing system separate from or internal to transmitter 190. An instruction or command in a computing system may cause transmitter 190 to transmit output signals. The instruction may include directions for signal properties of the transmitted output signals (e.g., such as wavelength and intensity). The instruction to control the output of the seismic signals may be programmed in an external device or program, for example, a computing system, or into transmitter 190 itself.

Computing system 130 may include, for example, any suitable processing system, computing system, computing device, processing device, computer, processor, or the like, and may be implemented using any suitable combination of hardware and/or software. Computing system 130 may include for example one or more processor(s) 140, memory 150 and software 160. Data 155 generated by reflected signals, received by receiver 120, may be transferred, for example, to computing system 130. The data may be stored in the receiver 120 as for example digital information and transferred to computing system 130 by uploading, copying or transmitting the digital information. Processor 140 may communicate with computing system 130 via wired or wireless command and execution signals.

Memory 150 may include cache memory, long term memory such as a hard drive, and/or external memory, for example, including random access memory (RAM), read only memory (ROM), dynamic RAM (DRAM), synchronous DRAM (SD-RAM), flash memory, volatile memory, non-volatile memory, cache memory, buffer, short term memory unit, long term memory unit, or other suitable memory units or storage units. Memory 150 may store instructions (e.g., software 160) and data 155 to execute embodiments of the aforementioned methods, steps and functionality (e.g., in long term memory, such as a hard drive). Data 155 may include, for example, well data, raw seismic data collected by receiver 120, instructions for building a mesh, instructions for partitioning a mesh, and instructions for processing the collected data to generate a model, or other instructions or data. Memory 150 may also store instructions to model a surface, or surface patch representing one or more faults in a subsurface region. Memory 150 may store a series of scalar functions and a series of level sets for generating a fault network. Memory 150 may store sampling point data initially collected, e.g., as well data, and then processed to define each fault. Memory 150 may store a set of types of relationships associated with two or more modeled faults. Memory 150 may store cells, nodes, voxels, etc., associated with the model and the model mesh. Data 155 may also include intermediate data generated by these processes and data to be visualized, such as data representing graphical models to be displayed to a user. Memory 150 may store intermediate data. Computing system 130 may include cache memory which may include data duplicating original values stored elsewhere or computed earlier, where the original data may be relatively more expensive to fetch (e.g., due to longer access time) or to compute, compared to the cost of reading the cache memory. Cache memory may include pages, memory lines, or other suitable structures. Additional or other suitable memory may be used.

Computing system 130 may include a computing module having machine-executable instructions. The instructions may include, for example, a data processing mechanism (including, for example, embodiments of methods described herein) and a modeling mechanism. These instructions may be used to cause processor 140 using associated software 160 modules programmed with the instructions to perform the operations described. Alternatively, the operations may be performed by specific hardware that may contain hardwired logic for performing the operations, or by any combination of programmed computer components and custom hardware components.

Embodiments of the invention may include an article such as a computer or processor readable medium, or a computer or processor storage medium, such as for example a memory, a disk drive, or a USB flash memory, encoding, including or storing instructions, e.g., computer-executable instructions, which when executed by a processor or controller, carry out methods disclosed herein.

Processor 140 may perform various methods described herein. For example, processor 140 may generate a scalar function f(x,y,z) from fault data (e.g., a function of distance to a fault surface). Processor 140 may assign sampling point associated with the fault a constant value for the scalar function, e.g., zero. A plurality of level sets may be generated accordingly to provide a fault network.

Processor 140 may generate a vector field of throw vectors, e.g., vectors which have a direction tangent to a fault surface and a magnitude corresponding to the displacement of fault blocks relative to each other. Embodiments of the invention provide a modeling mechanism for generating fault surfaces with protrusions or ridges only in a direction in which the fault blocks do not slide and not in the direction in which fault blocks do slide (e.g., unrealistic surface variations). Processor 140 may model the fault scalar function such that the gradient field thereof is substantially orthogonal to the direction of the throw vectors. That is, the fault surface may not have protrusions in the direction in which the fault blocks on opposite sides of the fault surface slide relative to each other, but may have protrusions in a direction orthogonal thereto.

Display 180 may display data from transmitter 190, receiver 120, or computing system 130 or any other suitable systems, devices, or programs, for example, an imaging program or a transmitter or receiver tracking device. Display 180 may include one or more inputs or outputs for displaying data from multiple data sources or to multiple displays. For example display 180 may display visualizations of subsurface models including subsurface features, such as faults and fault networks. Display 180 may display a plurality of models, wherein each model differs by the location of one or more faults. A color or symbol may be displayed to indicate the translated fault. In one embodiment, the user may select and translate a fault on a model on display 180 using input device(s) 165, for example, by dragging a mouse.

Input device(s) 165 may include a keyboard, pointing device (e.g., mouse, trackball, pen, touch screen), or cursor direction keys, communicating information and command selections to processor 140. Input device 165 may communicate user direction information and command selections to the processor 140. For example, a user may use input device 165 to select and translate one or more faults in a model (e.g., by pointing, highlighting and dragging a fault displayed on a display 180 monitor).

Processor 140 may include, for example, one or more processors, controllers, central processing units ("CPUs"), or graphical processing units ("GPUs"). Software 160 may be stored, for example, in memory 150. Software 160 may include any suitable software, for example, DSI software.

Processor 140 may initially generate a three dimensional mesh, lattice, or collection of nodes that spans or covers a domain of interest. The domain may cover a portion or entirety of the three-dimensional space sought to be modeled. Processor 140 may automatically compute the domain to be modeled and the corresponding mesh based on the collected data (e.g., seismic and/or well data) so that the mesh covers a portion or the entirety of the three-dimensional space from which data is collected (e.g., the studied subsurface region). Alternatively or additionally, the domain or mesh may be selected or modified by a user, for example, entering coordinates or highlighting regions of a simulated optional domain or mesh. For example, the user may select a domain or mesh to model a region of the Earth that is greater than a user-selected subsurface distance (e.g., 100 meters) below the Earth's surface, a domain that occurs relative to geological features (e.g., to one side of a known fault or riverbed), or a domain that occurs relative to modeled structures (e.g., between modeled faults $F_1$ and $F_2$ in a fault network). Processor 140 may execute software 160 to partition the mesh or domain into a plurality of three-dimensional (3D) cells, columns, or other modeled data (e.g., represented by voxels, pixels, data points, bits and bytes, computer code or functions stored in memory 150). The cells or voxels may have hexahedral, tetrahedral, or any other polygonal shapes, and preferably three-dimensional shapes. Alternatively, data may include zero-dimensional nodes, one-dimensional segments, two-dimensional facets and three-dimensional elements of volume, staggered in a three-dimensional space to form three-dimensional data structures, such as cells, columns or voxels. Each cell may include faces, edges and/or vertices. Each cell or node may correspond to or represent one or more particles of a subsurface material in the Earth (e.g., a cell may include many cubic meters of particles). Each cell, face, edge, vertex or node may be located, e.g., in a grid or lattice, throughout the model. In contrast, a point of the model may be located at any location in the modeled domain, for example, in the cells between adjacent nodes. In one embodiment, a mesh may be generated based on data collected by receiver 120, alternatively, a generic mesh may be generated to span the domain and the data collected by receiver 120 may be used to modify the structure thereof. For example, the data collected may be used to generate a set of point values at "sampling point." The values at these points may reorient the nodes or cells of the mesh to generate a model that spatially or otherwise represents the geological data collected from the Earth. Other or different structures, data points, or sequences of steps may be used to process collected geological data to generate a model. The various processes described herein (e.g., modeling faults) may be performed by manipulating such modeling data.

The scalar function f(x,y,z) (e.g., a signed distance function to a fault surface) may be defined at a finite number of nodes or sampling points based on real data corresponding to a subsurface structure, e.g., one or more particles or a volume of particles of Earth.

The geological time function may be approximated between nodes to continuously represent the subsurface structure, or alternatively, depending on the resolution in which the data is modeled, may represent discrete or periodic subsurface structures, e.g., particles or volumes of Earth that are spaced from each other.

In one embodiment, input data to computing system 130 may include fault sampling points, including well paths, well markers, or other data. Sampling points may be displayed on the structural model.

Fault surfaces and model boundaries (e.g., as lines or transparent surfaces) may be modeled and displayed on display 180. The relationship type between faults may be displayed, e.g., in a list adjacent to a display of the model of the corresponding faults or as a symbol or color code on the model itself (other display arrangements are possible). A distinct model may be generated for each different relationship type between faults. The distinct models are preferably displayed separately (e.g., a user may scan between them clicking a 'next' or 'previous' button) but may alternatively be displayed together (e.g., in different quadrants or sides or a monitor screen of display 180). Models of faults translated or rotated to different locations in the modeled domain may be displayed. A distinct model may be generated for each different location of one or more faults. The distinct models are preferably displayed separately but may alternatively be displayed together.

The computing device may accept the data used in the aforementioned operations as for example a set of data reflected from a subsurface geological feature, or such data augmented by another process. The computing device may accept one or more of seismic and well data. The computing device may generate one or more of seismic and well data.

Figure 8:
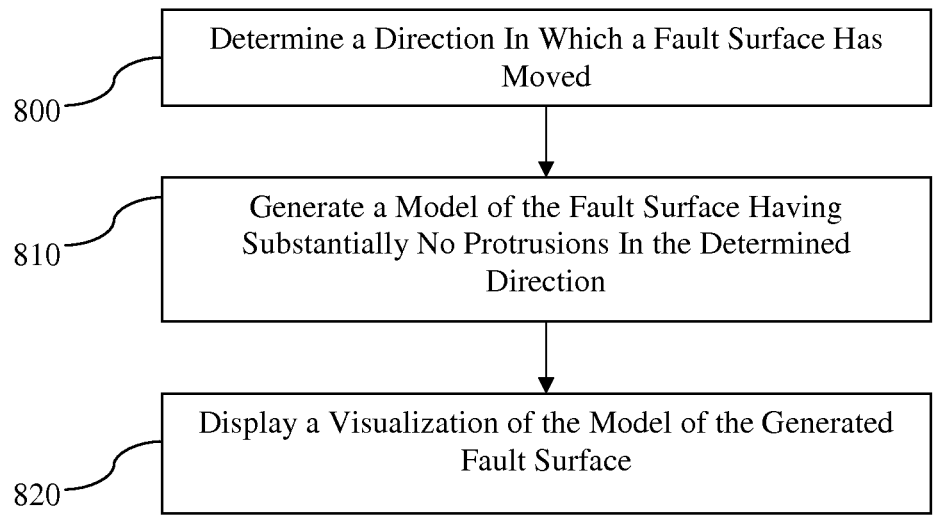
FIGS. 8-12 are flowcharts of methods according to embodiments of the invention.

Reference is made to FIG. 8, which is a flowchart of a method for modeling a fault surface in a subsurface region, which may be performed using system 105 of FIG. 7. Other operations or series of operations may be used, and the exact set of steps shown below may be varied.

In operation 800, a computing device (e.g. processor 140 of FIG. 7) may determine a direction in which a first portion of the subsurface region being on one side of the fault surface has moved relative to a second portion of the subsurface region being on the other side of the fault surface. The direction may be represented by a vector field including vectors tangent to the surface of the fault surface. The vector field may be stored in a computer memory. The direction may be constant or alternatively, changing, along the fault surface.

In operation 810, the computing device may generate a model of the fault surface having substantially no protrusions in the determined direction. A protrusion may include a local maximum or minimum of the surface topography of the fault surface or subsurface region on either side thereof. The model may have one or more protrusions in a direction orthogonal to the determined direction.

The fault surface may be modeled using a scalar function such that a gradient field of the scalar function is substantially orthogonal to the direction of the vector field. The scalar function may be a function of distance to the fault surface. The modeled fault surface may be oriented based on an average gradient of the scalar function along the fault surface.

The modeled fault surface may approximate a surface that includes a set of sampling points. When one or more of the sampling points lie outside of the plane and indicate a protrusion in the determined direction, the one or more sampling points may be removed from the set of sampling points. When sampling points are removed, a second model of the fault surface may be generated that approximates a surface that includes the set of sampling points from which sampling points have been removed.

In operation 820, a display device (e.g. display 180 of FIG. 7) may display a visualization of the model of the generated fault surface.

The computing device may accept the data used in the aforementioned operations as for example a set of data reflected from a subsurface geological feature, or such data augmented by another process. The computing device may generate one or more of seismic and well data.

Figure 9:
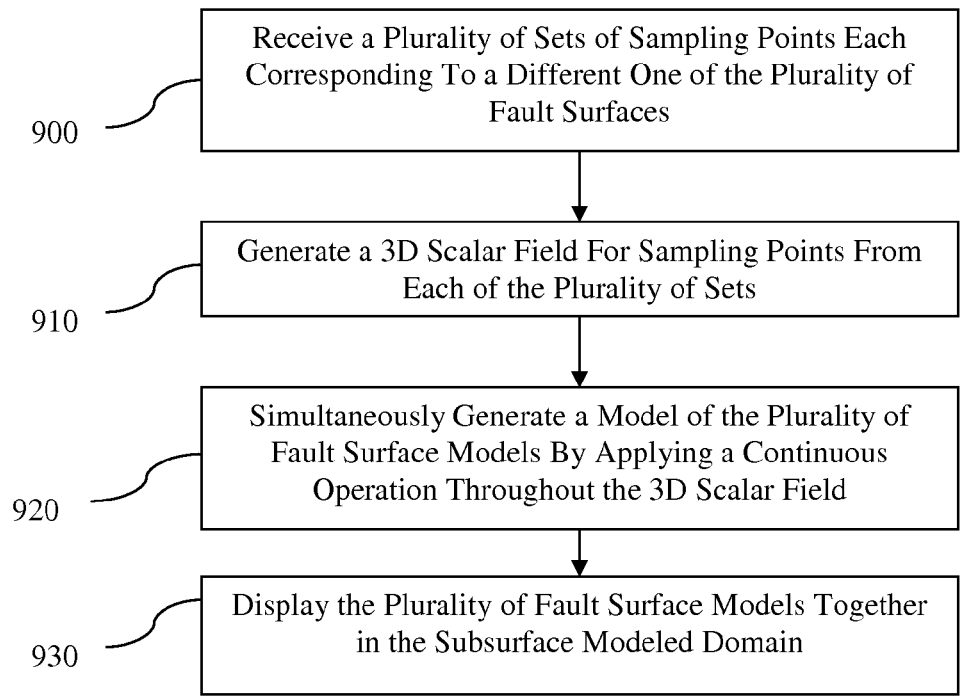

Reference is made to FIG. 9, which is a flowchart of a method for, in a subsurface modeled domain, modeling a plurality of fault surfaces that are substantially parallel, which may be performed using system 105 of FIG. 7. Other operations or series of operations may be used, and the exact set of steps shown below may be varied.

In operation 900, a computing device (e.g. processor 140 of FIG. 7) may receive a plurality of sets of sampling points each of which may correspond to a different one of the plurality of fault surfaces.

In operation 910, the computing device may generate a three-dimensional scalar field representing the values of sampling points from each of the plurality of sets.

In operation 920, the computing device may simultaneously generate a model of the plurality of fault surface models by applying a continuous operation throughout the three-dimensional scalar field. The plurality of fault surfaces may be modeled in a sub-region of the entire modeled domain, wherein the sub-region is a portion of the modeled domain in which the faults are substantially parallel.

In operation 930, a display device (e.g. display 180 of FIG. 7) may display the plurality of fault surface models together in the subsurface modeled domain.

The computing device may accept the data used in the aforementioned operations as for example a set of data reflected from a subsurface geological feature, or such data augmented by another process. The computing device may accept one or more of seismic and well data. The computing device may generate one or more of seismic and well data.

Figure 10:
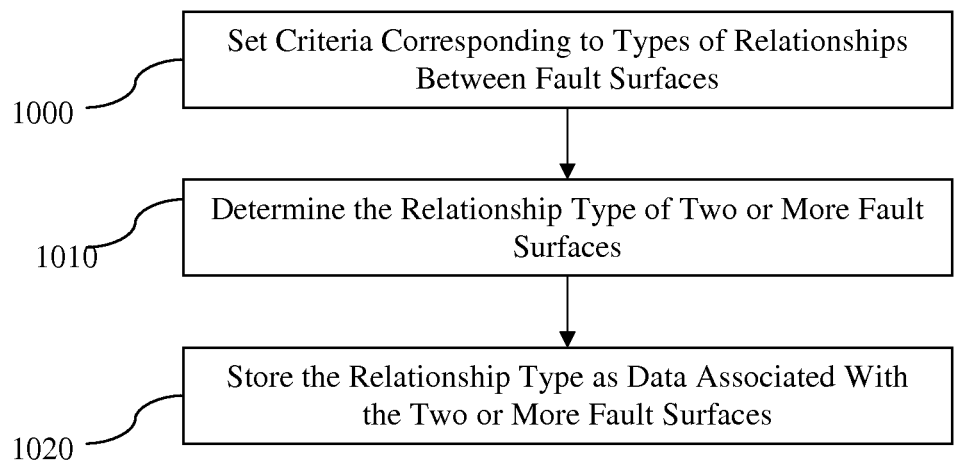

Reference is made to FIG. 10, which is a flowchart of a method for determining a relationship between fault surfaces in a subsurface region, which may be performed using system 105 of FIG. 7. Other operations or series of operations may be used, and the exact set of steps shown below may be varied.

In operation 1000, a computing device (e.g. processor 140 of FIG. 7) may set a plurality of predetermined criteria. Each criterion may correspond to one of a plurality of types of relationships between two or more fault surfaces and each predetermined criterion may relate to the spatial coincidence of one fault with another. The types of relationships between two or more fault surfaces may include, for example, the two or more fault surfaces do not intersect, the two or more fault surfaces cross, a first of the two or more fault surfaces is a secondary fault that branches from the second of the two or more fault surfaces which is a main fault, and the second of the two or more fault surfaces is a secondary fault that branches from the first of the two or more fault surfaces which is a main fault.

In operation 1010, the computing device may determine that the two or more fault surfaces have a relationship type that corresponds to one of the predetermined criteria that is met by the spatial coincidence of the two or more fault surfaces. For example, if the computing device calculates that a substantial number (e.g., greater than half or another predetermined percentage) of points of a first of the fault surfaces are located on both sides of a second of the fault surfaces and a substantial number (e.g., greater than half or another predetermined percentage) of points of the second fault surface are located on one side of the first fault surface, then the computing device may automatically determine that the first fault surface is a main fault and the second fault surface is a secondary fault surface that branches from the first fault surface. If the computing device determines that there is no substantial spatial coincidence between the two or more fault surfaces, then the computing device may automatically determine that the two or more fault surfaces do not intersect. If the computing device determines that none of the predetermined criteria for relationship types are met, the computing device may determine that the two or more fault surfaces have a predetermined default relationship type.

In operation 1020, a computer memory (e.g., memory 150 of FIG. 7) may store the relationship type as data associated with the two or more fault surfaces.

If an arrangement of the two or more fault surfaces in a current model differs from the determined relationship type, the current model may be edited, e.g., at the intersection of the faults, to generate a new arrangement of the faults having the determined relationship type. For example, one or more faults may be translated, rotated, and/or the angle between the faults may be corrected.

The computing device may accept the data used in the aforementioned operations as for example a set of data reflected from a subsurface geological feature, or such data augmented by another process. The computing device may accept one or more of seismic and well data. The computing device may generate one or more of seismic and well data.

Figure 11:
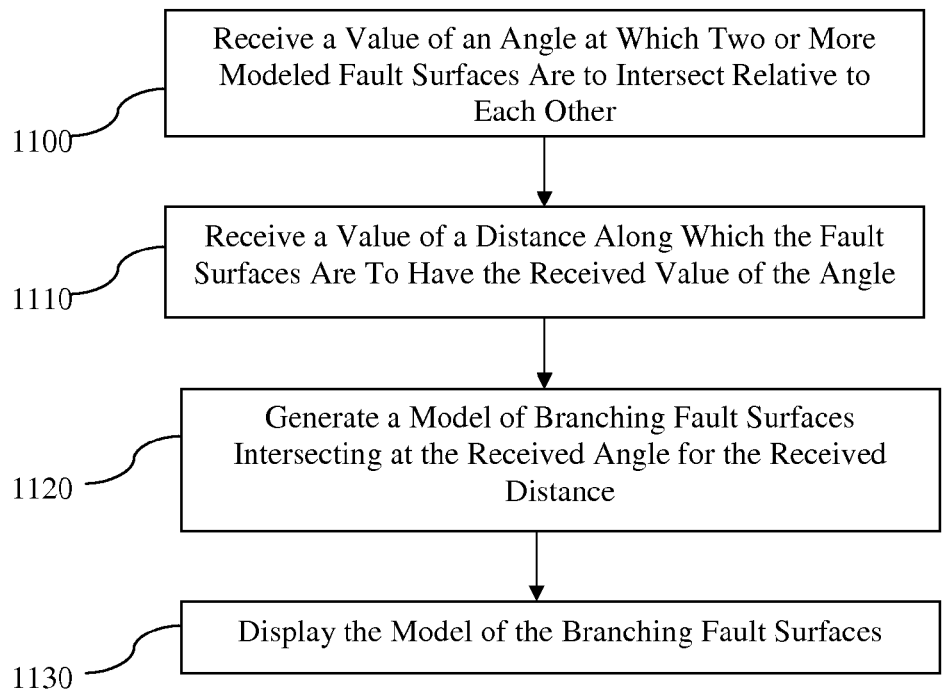

Reference is made to FIG. 11, which is a flowchart of a method for modeling branching fault surfaces in a subsurface region, which may be performed using system 105 of FIG. 7. Other operations or series of operations may be used, and the exact set of steps shown below may be varied.

In operation 1100, a computing device (e.g. processor 140 of FIG. 7) may receive a value of an angle at which the two or more modeled fault surfaces are to intersect relative to each other. The received angle value may be in a range of from zero to $\pi/2$ radians.

In operation 1110, the computing device may receive a value of a distance from the intersection of the faults along which the two or more modeled fault surfaces are to have the received value of the angle. The distance may be measured in a line along one of the two or more modeled fault surfaces.

In operation 1120, the computing device may generate a model of branching fault surfaces, in which the branching fault surfaces in the model intersect at an angle approximately equal to the received angle value and where the angle between the branching fault surfaces is approximately equal to the received angle value for a distance along the branching fault surfaces approximately equal to the received distance. The model may be modified from an initial model in a region near the intersection point of the two or more modeled fault surfaces. The computing device may automatically determine the region near the intersection point, e.g., based on an uncertainty of data near the intersection point of the two or more modeled fault surfaces.

In operation 1130, a display device (e.g. display 180 of FIG. 7) may display the model of the branching fault surfaces.

The computing device may accept the data used in the aforementioned operations as for example a set of data reflected from a subsurface geological feature, or such data augmented by another process. The computing device may accept one or more of seismic and well data. The computing device may generate one or more of seismic and well data.

Figure 12:
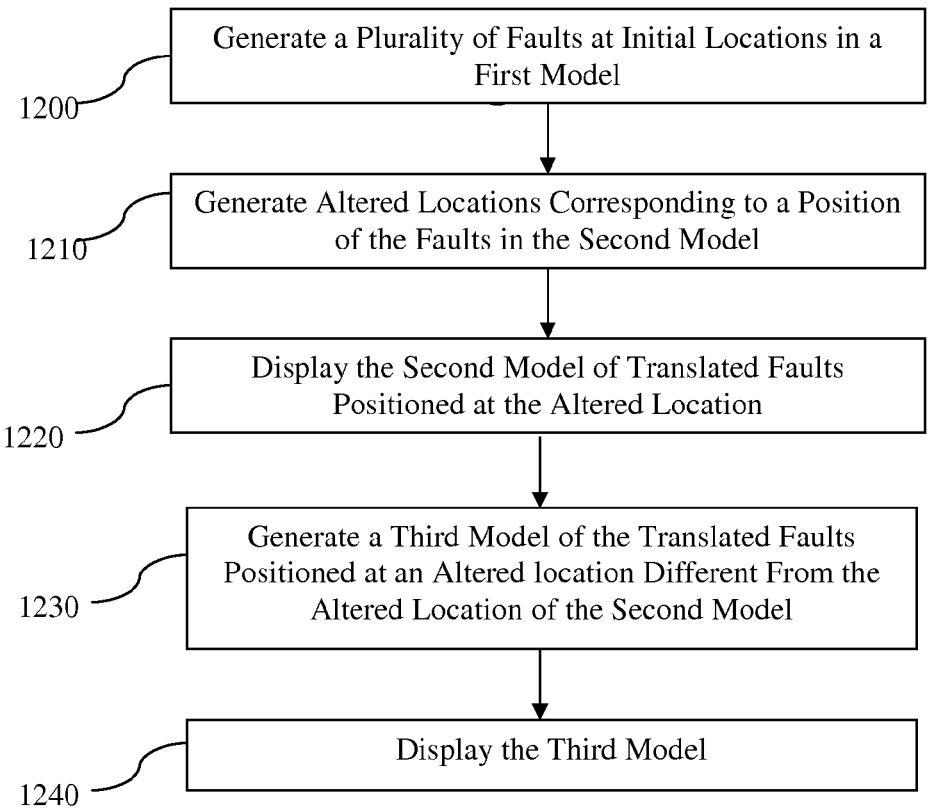

Reference is made to FIG. 12, which is a flowchart of a method for translating faults in a subsurface model, which may be performed using system 105 of FIG. 7. Other operations or series of operations may be used, and the exact set of steps shown below may be varied.

In operation 1200, a computing device (e.g. processor 140 of FIG. 7) may generate a plurality of faults in a first model using data relating to spatial coincidence of one fault with another. Each fault may be positioned at an initial location.

In operation 1210, the computing device may generate one or more altered locations each corresponding to a position of one or more faults in the second model. The altered locations corresponding to the position of the one or more faults in the second model may be different than the initial location corresponding to the one or more faults in the first model.

In operation 1220, a display device (e.g. display 180 of FIG. 7) may display the second model of the one or more translated faults positioned at the altered location and the remaining faults in the plurality of faults positioned at their location in the first model.

In operation 1230, the computing device may generate a third model of the one or more translated faults positioned at an altered location different from the altered location of the second model.

In operation 1240, the display device may display the third model.

The computing device may accept the data used in the aforementioned operations as for example a set of data reflected from a subsurface geological feature, or such data augmented by another process. The computing device may accept one or more of seismic and well data. The computing device may generate one or more of seismic and well data.

In the foregoing description, various aspects of the present invention have been described. For purposes of explanation, specific configurations and details have been set forth in order to provide a thorough understanding of the present invention. However, it will also be apparent to one skilled in the art that the present invention may be practiced without the specific details presented herein. Furthermore, well known features may have been omitted or simplified in order not to obscure the present invention. Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices. In addition, the term "plurality" may be used throughout the specification to describe two or more components, devices, elements, parameters and the like.

Embodiments of the invention may manipulate data representations of real-world objects and entities such as underground geological features, including faults and other features. Data received by for example a receiver receiving waves generated by an air gun or explosives, or from well data, may be manipulated and stored, e.g., in memory 150, and data such as images representing underground features may be presented to a user, e.g., as a visualization on display 180.

When used herein, geological features such as faults or subsurface structures may refer to the actual geological feature existing in the real world, or computer data representing such features (e.g., stored in a memory or mass storage device). Some features when represented in a computing device may be approximations or estimates of a real world feature, or a virtual or idealized feature, such as an idealized fault. A model, or a model representing subsurface features or the location of those features, is typically an estimate or a "model", which may approximate or estimate the physical subsurface structure being modeled with more or less accuracy.

It should be recognized that embodiments of the present invention may solve one or more of the objectives and/or challenges described in the background, and that embodiments of the invention need not meet every one of the above objectives and/or challenges to come within the scope of the present invention. While certain features of the invention have been particularly illustrated and described herein, many modifications, substitutions, changes, and equivalents

What is claimed is:

1. A method for modeling a fault surface in a subsurface region using measured data, the method comprising:
   determining, by a processor, a direction of sliding in which a first portion of the subsurface region being on one side of the fault surface has moved relative to a second portion of the subsurface region being on the other side of the fault surface;
   for the fault surface estimated to have at least one protrusion in the direction of sliding, replacing a first gradient field of the fault surface that is not substantially orthogonal to the direction of sliding with a second gradient field of the fault surface that is substantially orthogonal to the direction of sliding;
   generating, by the processor, a model of the fault surface using the second gradient field of the fault surface that is substantially orthogonal to the direction of sliding, by which protrusions are permitted in a direction orthogonal to the direction of sliding, and not permitted in the direction of sliding; and
   displaying a visualization of the model of the generated fault surface in the subsurface region.

2. The method of claim 1, wherein protrusions comprise a local maximum or minimum of the surface topography.

3. The method of claim 1, wherein the model of the fault surface has one or more protrusions in a direction orthogonal to the direction of sliding.

4. The method of claim 1, wherein the direction of sliding is represented by a throw vector field including vectors tangent to the surface of the fault surface.

5. The method of claim 4, wherein the vector field is stored in a computer memory.

6. The method of claim 4, comprising modeling the fault surface using a scalar function and wherein the second gradient field of the scalar function is orthogonal to the direction of the throw vector field.

7. The method of claim 6, wherein the scalar function is a function of distance to the fault surface.

8. The method of claim 6, wherein the modeled fault surface is oriented based on an average gradient of the scalar function along the fault surface.

9. The method of claim 1, wherein the direction of sliding is constant along the fault surface.

10. The method of claim 1, wherein the direction of sliding changes along the fault surface.

11. The method of claim 1, wherein the modeled fault surface approximates a surface that includes a set of sampling points.

12. The method of claim 1, comprising:
    when one or more of the sampling points indicate a protrusion in the direction of sliding, removing the one or more sampling points from the set of sampling points; and
    generating a second model of the fault surface that approximates a surface that includes a set of sampling points in which the one or more sampling points are removed.

13. The method of claim 1, wherein the model generated by the processor allows the geological structures on either side of the fault surface to slide relative to each other without obstruction.

14. The method of claim 1, wherein the model of the fault surface is an implicit model.

15. A system comprising:
    a memory to store a subsurface geological model;
    a processor configured to model a fault surface in a subsurface region using measured data by:
       determining a direction of sliding in which a first portion of the subsurface region being on one side of the fault surface has moved relative to a second portion of the subsurface region being on the other side of the fault surface; and
       for the fault surface estimated to have at least one protrusion in the direction of sliding, replacing a first gradient field of the fault surface that is not substantially orthogonal to the direction of sliding with a second gradient field of the fault surface that is substantially orthogonal to the direction of sliding;
       generating a model of the fault surface using the second gradient field of the fault surface that is substantially orthogonal to the direction of sliding, by which protrusions are permitted in a direction orthogonal to the direction of sliding, and not permitted in the direction of sliding; and
    a display to display a visualization of the model of the generated fault surface in the subsurface region.

16. The system of claim 15, wherein the model of the fault surface has one or more protrusions in a direction orthogonal to the direction of sliding.

17. The system of claim 15, wherein the processor is to represent the direction of sliding by a throw vector field including vectors tangent to the surface of the fault surface.

18. The system of claim 15, wherein the processor is to approximate the modeled fault surface by a surface that includes a set of sampling points.

19. The system of claim 15, wherein when one or more of the sampling points indicates a protrusion in the direction of sliding, the processor is to remove the one or more sampling points from the set of sampling points and generate a second model of the fault surface that approximates a surface that includes a set of sampling points in which the one or more sampling points are removed.

20. The system of claim 15, wherein the model generated by the processor allows the geological structures on either side of the fault surface to slide relative to each other without obstruction.

21. A non-transitory computer readable medium comprising instructions which when implemented in a processor of a computing system having a display cause the system to model a fault surface in a subsurface region using measured data by:
    determining a direction of sliding in which a first portion of the subsurface region being on one side of the fault surface has moved relative to a second portion of the subsurface region being on the other side of the fault surface;
    for the fault surface estimated to have at least one protrusion in the direction of sliding, replacing a first gradient field of the fault surface that is not substantially orthogonal to the direction of sliding with a second gradient field of the fault surface that is substantially orthogonal to the direction of sliding;
    generating a model of the fault surface using the second gradient field of the fault surface that is substantially orthogonal to the direction of sliding, by which protrusions are permitted in a direction orthogonal to the direction of sliding, and not permitted in the direction of sliding; and
    displaying a visualization of the model of the generated fault surface in the subsurface region.

* * * * *